United States Patent
Ma et al.

(10) Patent No.: US 11,635,734 B2
(45) Date of Patent: Apr. 25, 2023

(54) INTERVAL ERROR OBSERVER-BASED AIRCRAFT ENGINE ACTIVE FAULT TOLERANT CONTROL METHOD

(71) Applicant: Dalian University of Technology, Liaoning (CN)

(72) Inventors: Yanhua Ma, Liaoning (CN); Xian Du, Liaoning (CN); Ye Wang, Liaoning (CN); Rui Wang, Liaoning (CN); Ximing Sun, Liaoning (CN)

(73) Assignee: DALIAN UNIVERSITY OF TECHNOLOGY, Liaoning (CN)

( * ) Notice: Subject to any disclaimer, the term of this patent is extended or adjusted under 35 U.S.C. 154(b) by 790 days.

(21) Appl. No.: 16/609,940

(22) PCT Filed: Jan. 10, 2019

(86) PCT No.: PCT/CN2019/071178
§ 371 (c)(1),
(2) Date: Oct. 31, 2019

(87) PCT Pub. No.: WO2020/142984
PCT Pub. Date: Jul. 16, 2020

(65) Prior Publication Data
US 2020/0326672 A1 Oct. 15, 2020

(51) Int. Cl.
*G05B 13/04* (2006.01)
*G05B 23/02* (2006.01)
(Continued)

(52) U.S. Cl.
CPC ....... *G05B 13/042* (2013.01); *G05B 23/0254* (2013.01); *G05D 1/101* (2013.01); *G06F 30/20* (2020.01)

(58) Field of Classification Search
CPC .............. G05B 13/042; G05B 23/0254; G05B 23/0289; G05D 1/101; G06F 30/20; F02C 9/00
See application file for complete search history.

(56) References Cited

U.S. PATENT DOCUMENTS

2016/0236790 A1* 8/2016 Knapp ................ G08G 5/0021

FOREIGN PATENT DOCUMENTS

CN  103324202 A  *  9/2013
CN  105353615 A  *  2/2016  ............. G05B 13/04
(Continued)

OTHER PUBLICATIONS

Saul Montes de Oca et al.; "Robust fault detection based on adaptive threshold generation using interval LPV observers"; (Year: 2012).*
(Continued)

*Primary Examiner* — Rehana Perveen
*Assistant Examiner* — Nupur Debnath
(74) *Attorney, Agent, or Firm* — Muncy, Geissler, Olds & Lowe, P.C.

(57) ABSTRACT

The present invention provides an interval error observer-based aircraft engine active fault tolerant control method, and belongs to the technical field of aircraft control. The method comprises: tracking the state and the output of a reference model of an aircraft engine through an error feedback controller; compensating a control system of the aircraft engine having a disturbance signal and actuator and sensor faults through a virtual sensor and a virtual actuator; observing an error between a system with fault of the aircraft engine and the reference model through an interval error observer, and feeding back the error to the error feedback controller; and finally, using a difference between the output of the reference model of the system with fault and the
(Continued)

output of the virtual actuator as a control signal to realize active fault tolerant control of the aircraft engine.

1 Claim, 18 Drawing Sheets

(51) Int. Cl.
*G06F 30/20* (2020.01)
*G05D 1/10* (2006.01)

(56) References Cited

FOREIGN PATENT DOCUMENTS

| | | | | | |
|---|---|---|---|---|---|
| CN | 105574271 | A | * | 5/2016 | |
| CN | 105626270 | A | | 6/2016 | |
| CN | 106527137 | A | * | 3/2017 | |
| CN | 106842952 | A | * | 6/2017 | ........... G05B 13/042 |
| CN | 106843254 | A | * | 6/2017 | ........... G05D 1/0808 |
| CN | 104238565 | B | * | 7/2017 | |
| CN | 107942653 | A | | 4/2018 | |
| CN | 108062428 | A | | 5/2018 | |
| CN | 108563131 | A | * | 9/2018 | ........... G05B 13/042 |
| CN | 108897309 | A | | 11/2018 | |
| CN | 109085757 | A | | 12/2018 | |
| CN | 109116736 | A | * | 1/2019 | ........... G05B 13/042 |
| CN | 109630281 | A | * | 4/2019 | ............... F02C 9/00 |
| CN | 109799803 | A | * | 5/2019 | ............... B64F 5/60 |
| EP | 3626485 | A1 | * | 3/2020 | ........... B60G 11/265 |
| WO | WO-2009135653 | A1 | * | 11/2009 | ............. B64C 13/42 |
| WO | WO-2009138251 | A1 | * | 11/2009 | ............. B64C 13/42 |
| WO | WO2018055825 | A1 | | 3/2018 | |

OTHER PUBLICATIONS

W.P.M.H. Heemels et al.; "Design of observer-based controllers for LPV systems with unknown parameters"; Joint 48th IEEE Conference on Decision and Control and 28th Chinese Control Conference (Year: 2009).*
Lejun Chen et al.; "Application of Model-based LPV actuator fault estimation for an Industrial benchmark"; (Year: 2016).*
Xiaodong Chan et al.; "Robust In-Flight Sensor Fault Diagnostics for Aircraft Engine Based on Sliding Mode Observers"; (Year: 2017).*
M. Verhaegen et al.; "Fault Tolerant Flight Control—A Survey"; https://citeseerx.ist.psu.edu/viewdoc/download;jsessionid=9ABA24FB391DB91DE34A369645F97E6B?doi=10.1.1.464.2415&rep=rep1&type=pdf (Year: 2010).*

* cited by examiner

INTERVAL ERROR OBSERVER-BASED AIRCRAFT ENGINE ACTIVE FAULT TOLERANT CONTROL METHOD

TECHNICAL FIELD

The present invention relates to an interval error observer-based aircraft engine active fault tolerant control method, belongs to the technical field of aircraft control, and particularly relates to an active fault tolerant control method which is applied when aircraft engines have actuator and sensor fault under disturbances.

BACKGROUND

As the only power plant of an aircraft, an aircraft engine directly affects the safety, reliability and economy of the aircraft. Although reliable control system design can reduce the incidence of system fault, the actual system has complex structure and operates at high intensity; the factors that may cause the fault in the system are increased greatly; the types of the fault become increasingly diverse; and the fault of components is inevitable. As a driving component of the aircraft engine, the actuator is closely related to the state adjustment of the system. The actuator has large workload and complicated structure, and easiest to fail. Once the actuator fails, the entire system is collapsed, which causes a serious impact. The sensor is responsible for receiving and transmitting information of the aircraft engine system. The presence of sensor fault directly affects the safety and the reliability of the system. Therefore, it is of great significance to improve the fault-tolerant capacity of the system and ensure the stability and performance criteria of the system after the fault. Traditional fault tolerant control methods also face new challenges.

In general, fault tolerant control research methods are classified into two categories: passive fault tolerant control and active fault tolerant control. The idea of passive fault tolerant control is to pre-design a controller based on pre-judged possible faults, and passive fault tolerant control is a controller design method based on a robust control technology. When a fault occurs, the designed controller is called to keep an entire closed-loop system insensitive to the fault, thereby achieving the stability of the system. However, as the system becomes more and more complex, the types and number of the faults that may occur are increased. Therefore, the traditional passive fault tolerant control has great limitations, that is, all possible fault conditions need to be considered in advance, resulting in certain conservation of the controller. To reduce the conservation of the control system, active fault tolerant control that reconfigures the system becomes a research hotspot. The idea of active fault tolerant control is to realize online fault compensation by readjusting the parameters of the controller or reconfiguring the system after the fault occurs. That is, when there is no fault, the system is operated normally; and once the fault occurs, the system automatically adjusts or reconfigures a control law. The aircraft engine can be generally described as a linear-parameter-varying (LPV) system. Existing research results use a gain self-scheduling H-infinite optimization method when processing active fault tolerant control of the LPV system having actuator and sensor faults. The method readjusts the controller parameters when the system has the fault, thereby increasing the complexity of the system design. In addition, the control system of the aircraft engine is often interfered by noise signals. The existing methods have no ideal solution for the active fault tolerant control of the sensors and actuator faults of the aircraft engine when processing the interference signals.

SUMMARY

The technical problem of the present invention is: when the aircraft engine have the actuator and sensor faults and the control system is affected by noise signal interference, to solve the defects of the existing control method, the present invention provides an interval error observer-based aircraft engine active fault tolerant control method which can ensure that the aircraft engine can track a reference model without changing the structure and parameters of the controller. Namely, the reconfigured system has the same state and output as an original fault-free system, realizes a desired control objective, enables the system to have the capability to eliminate the faults autonomously, enhances the operating reliability of the aircraft engine and reduces maintenance cost of the aircraft engine.

The technical solution of the present invention is:

An interval error observer-based aircraft engine active fault tolerant control method comprises the following steps:

step 1.1: establishing an affine parameter-dependent aircraft engine linear-parameter-varying (LPV) model $$\dot{x}_p(t)=[A_0+\Delta A(\theta)]x_p(t)+[B_0+\Delta B(\theta)]u_p(t)+d_f(t)$$

$$y_p(t)=C_p x_p(t)+v(t) \quad (1)$$

where $R^m$ and $R^{m \times n}$ respectively represent a m-dimensional real number column vector and a m-row n-column real matrix; state vectors $x_p=[Y_{nl}\ Y_{nh}]^T \in R^{n_x}$, $Y_{nl}$ and $Y_{nh}$ respectively represent variation of relative conversion speed of low pressure and high pressure rotors; $n_x$ represents the dimension of a state variable x; $n_y$ represents the dimension of an output vector y; $n_u$ represents the dimension of control input $u_p$; control input $u_{p_f}=U_{p_f} \in R^{n_x}$ is a fuel pressure step signal; output vectors $y_p=Y_{nh} \in R^{n_y}$, $A_0 \in R^{n_x \times n_x}$, $B_0 \in R^{n_x \times n_x}$ and $C_p \in R^{n_y \times n_x}$ are known system constant matrices; $d_f(t)$ is a disturbance variable; the relative conversion speed $n_h$ of the high pressure rotor of the aircraft engine is a scheduling parameter $\theta \in R^p$; system variable matrices $\Delta A(\theta)$ and $\Delta B(\theta)$ satisfy $-\overline{\Delta A} \le \Delta A(\theta) \le \overline{\Delta A}$ and $-\overline{\Delta B} \le \Delta B(\theta) \le \overline{\Delta B}$; $\overline{\Delta A} \in R^{n_x \times n_x}$ is an upper bound of $\Delta A(\theta)$; $\overline{\Delta B} \in R^{n_x \times n_u}$ is an upper bound of $\Delta B(\theta)$; $\overline{\Delta A} \ge 0$, $\overline{\Delta B} \ge 0$; a state variable initial value $x_p(0)$ satisfies $\underline{x}_0 \le x_p(0) \le \overline{x}_0$; $x_0, \overline{x}_0 \in R^{n_x}$ are respectively known upper bound and lower bound of the state variable initial value $x_p(0)$; $\overline{d}, \underline{d} \in R^{n_x}$ are known upper bound and lower bound of an unknown disturbance $d_f(t)$; sensor noise $v(t)$ satisfies $|v(t)|<V$; V is a known bound; $V>0$;

step 1.2: defining reference model of fault-free system of the aircraft engine (1) as $$\dot{x}_{pref}(t)=A_0 x_{pref}(t)+B_0 u_{pref}(t)$$

$$y_{pref}(t)=C_p x_{pref}(t) \quad (2)$$

where $x_{pref} \in R^{n_x}$ is a reference state vector of the fault-free system; $u_{pref} \in R^{n_x}$ is control input of the fault-free system; $y_{pref} \in R^{n_y}$ is a reference output vector; an error feedback controller of the fault-free system of the aircraft engine is designed according to the aircraft engine LPV model established in the step 1.1;

step 1.2.1: defining an error $e_p(t)=x_{pref}(t)-x_p(t)$ between the affine parameter-dependent aircraft engine LPV model and the reference model of the fault-free system of the aircraft engine to obtain error state equations of the fault-free system:

$$\dot{e}_p(t)=[A_0+\Delta A(\theta)]e_p(t)+[B_0+\Delta B(\theta)]\Delta u_{cp}(t)-\Delta A(\theta)x_{pref}(t)-\Delta B(\theta)u_{pref}(t)-d_f(t)$$

$$\varepsilon_{cp}(t)=C_p e_p(t)-v(t) \quad (3)$$

where $\Delta u_{cp}(t)$ and $\varepsilon_{cp}(t)$ represent the input and output difference between the reference model and aircraft engine LPV model with $\Delta u_{cp}(t)=u_{pref}(t)-u_p(t)$ and $\varepsilon_{cp}(t)=y_{pref}(t)-y_p(t)$, respectively;

step 1.2.2: representing state equations of the upper bound $\bar{e}_p$ and the lower bound $\underline{e}_p$ of the error vector $e_p$ as:

$$\dot{\bar{e}}_p(t)=[A_0-LC_p]\bar{e}_p(t)+[B_0+\overline{\Delta B}]\Delta u_{cp}(t)+L\varepsilon_{cp}(t)+|L|V-\underline{d}(t)+\overline{\Delta A}|x_{pref}(t)|+\phi_p(t)$$

$$\dot{\underline{e}}_p(t)=[A_0-LC_p]\underline{e}_p(t)+[B_0-\overline{\Delta B}]\Delta u_{cp}(t)+L\varepsilon_{cp}(t)-|L|V-\bar{d}(t)-\overline{\Delta A}|x_{pref}(t)|-\phi_p(t) \quad (4)$$

where $\bar{e}_p, \underline{e}_p \in R^{n_x}$ are respectively the upper bound and the lower bound of the error vector $e_p$, i.e., $\underline{e}_p(t) \le e_p(t) \le \bar{e}_p(t)$; $\phi_p(t)=\overline{\Delta A}(\bar{e}_p^+(t)+\underline{e}_p^-(t))$, $\bar{e}_p^+=\max\{0,\bar{e}_p\}$, $\bar{e}_p^-=\bar{e}_p^+-\bar{e}_p$, $\underline{e}_p^+=\max\{0,\underline{e}_p\}$, $\underline{e}_p^-=\underline{e}_p^+-\underline{e}_p$; $L \in R^{n_x \times n_y}$ is an error gain matrix of the fault-free system and satisfies $A_0-LC_p \in M^{n_x \times n_x}$; $M^{n_x}$ represents a set of $n_x$-dimensional Metzler matrix; $|L|$ represents taking absolute values of all elements of the matrix L;

step 1.2.3: respectively setting $e_{pa}=0.5(\bar{e}_p+\underline{e}_p)$ and $e_{pd}=\bar{e}_p-\underline{e}_p$, which represent the middle value and range of the interval of $e_p$, respectively; rewriting the formula (4) as:

$$\dot{e}_{pd}(t)=[A_0-LC_p]e_{pd}(t)+2\overline{\Delta B}\Delta u_{cp}(t)+\phi_{pd}(t)+\delta_{pd}(t)$$

$$\dot{e}_{pa}(t)=[A_0-LC_p]e_{pa}(t)+B_0\Delta u_{cp}(t)+LC_p e_p(t)+\delta_{pa}(t) \quad (5)$$

where $\phi_{pd}(t)$, $\delta_{pa}(t)$ and $\delta_{pd}(t)$ are variables defined as $$\phi_{pd}(t)=2\overline{\Delta A}(\bar{e}_p^-(t)+\underline{e}_p^-(t))$$

$$\delta_{pd}(t)=2|L|V-\underline{d}(t)+\bar{d}(t)+2\Delta A|x_{pref}(t)|$$

$$\delta_{pa}(t)=-Lv(t)-0.5(\underline{d}(t)+\bar{d}(t)) \quad (6)$$

step 1.2.4: defining output signal of the error feedback controller as:

$$\Delta u_{cp}(t)=K_a e_{pa}(t)+K_d e_{pd}(t) \quad (7)$$

where $K_d, K_a \in R^{n_x \times n_x}$ represent gain matrices of the error feedback controller (7); setting $e_x(t)=e_p(t)-e_{pa}(t)$, $-0.5 e_{pd}(t) \le e_x(t) \le 0.5 e_{pd}(t)$, and then $$\dot{e}_{pa}(t)=[A_0+B_0 K_a]e_{pa}(t)+B_0 K_d e_{pd}(t)+LC_p e_x(t)+\delta_{pa}(t) \quad (8)$$

step 1.2.5: rewriting formulas (5) and (8) as:

$$\dot{\xi}_p(t)=G_p(t)\xi_p(t)+\delta_p(t) \quad (9)$$

$$G_p(t)=\begin{bmatrix} A_0-LC_p & 0 \\ B_0 K_d & A_0+B_0 K_a \end{bmatrix}+A_{pd}(t) \quad (10)$$

where $\xi_p(t)$ is an error vector composed of the range of the error interval $e_{pd}$ and middle value of the error interval $e_{pa}$ with $$\xi_p(t)=\left[e_{pd}(t)^T, e_{pa}(t)^T\right]^T,$$

$$\delta_p(t)=\left[\left(\delta_{pd}(t)+2\overline{\Delta B}\Delta u_{cp}(t)\right)^T, \delta_{pa}(t)^T\right]^T$$

and then $$\begin{bmatrix} \phi_{pd} \\ LC_p e_x \end{bmatrix} = A_{pd}\begin{bmatrix} e_{pd} \\ e_{pa} \end{bmatrix}$$

step 1.2.6: $S^{m \times m}$ representing an m-dimensional real symmetric square matrix; setting a matrix $E, F \in SR^{2n_x \times 2n_x}$; $E, F > 0$ representing that each element in E, F is greater than 0; constant $\lambda > 0$; and obtaining a matrix inequality:

$$G_p^T E+EG_p+\lambda E+F \prec 0 \quad (12)$$

namely, setting each element in $G_p^T E+EG_p+\lambda E+F$ to be less than 0; solving the matrix inequality (12) to obtain the gain matrices $K_d$, $K_a$ of the error feedback controller so as to obtain the error feedback controller from (7);

step 1.3: describing the aircraft engine LPV model having disturbance and actuator and sensor faults as:

$$\dot{x}_f(t)=[A_0+\Delta A(\theta)]x_f(t)+B_f(\gamma(t))u_f(t)+d_f(t)$$

$$y_f(t)=C_f(\phi(t))x_f(t)+v(t) \quad (13)$$

where $x_f \in R^{n_x}$ is a state vector of a system with fault; $u_f \in R^{n_x}$ is the control input of the system with fault; $y_f \in R^{n_y}$ is an output vector of the system with fault; $B_f(\gamma(t))$ and $C_f(\phi(t))$ are respectively actuator and sensor faults, expressed as $$B_f(\gamma(t))=[B_0+\Delta B(\theta)]\text{diag}(\gamma_1(t), \ldots, \gamma_n(t))$$

$$C_f(\phi(t))=C_p \text{diag}(\phi_1(t), \ldots, \phi_n(t)) \quad (14)$$

where $0 \le \gamma_i(t) \le 1$ and $0 \le \phi_j(t) \le 1$ respectively represent the failure degree of the i th actuator and the j th sensor; $\gamma_i=1$ and $\gamma_i=0$ respectively represent health and complete failure of the i th actuator; $\phi_j$ is similar; $\text{diag}(\gamma_1, \gamma_2, \ldots, \gamma_n)$ represents a diagonal matrix with diagonal elements $\gamma_1, \gamma_2, \ldots, \gamma_n$; $\text{diag}(\phi_1, \phi_2, \ldots, \phi_n)$ is similar; setting $\gamma(t)$ and $\phi(t)$ estimated values respectively as $\hat{\gamma}(t)$ and $\hat{\phi}(t)$, and then $$B_f(\gamma(t))=B_f(\hat{\gamma}(t))+B_f(\Delta\gamma(t))$$

$$C_f(\phi(t))=C_f(\hat{\phi}(t))+C_f(\Delta\phi(t)) \quad (15)$$

where $\Delta\gamma(t)=\gamma(t)-\hat{\gamma}(t)$ and $\Delta\phi(t)=\phi(t)-\hat{\phi}(t)$ are respectively errors of estimation of $\gamma(t)$ and $\phi(t)$; a virtual actuator and a virtual sensor are respectively designed according to the actuator and sensor faults;

step 1.3.1: designing the virtual sensor as:

$$\dot{x}_{vs}(t)=A_{vs}(\theta)x_{vs}(t)+B_f(\hat{\gamma}(t))\Delta u(t)+Qy_f(t)$$

$$\hat{y}_f(t)=C_{vs}x_{vs}(t)+Py_f(t) \quad (16)$$

where $$A_{vs}(\theta)=A_0+\Delta A(\theta)-QC_f(\hat{\phi}(t))$$

$$C_{vs}=C_p-PC_f(\hat{\phi}(t)) \quad (17)$$

where $x_{vs} \in R^{n_x}$ is a state variable of a virtual sensor system; $\Delta u \in R^{n_x}$ is a difference in control inputs of a fault model and a fault reference model; $\hat{y}_f \in R^{n_y}$ is an output vector of the virtual sensor system; Q and P are respectively parameter matrices of the virtual sensor;

step 1.3.2: an LMI region $S_1(\rho_1, q_1, r_1, \theta_1)$ representing an intersection of a left half complex plane region with a bound of $-\rho_1$, a circular region with a radius of $r_1$ and a circle center of $q_1$ and a fan region having an intersection angle $\theta_1$ with a negative real axis; representing a state matrix $A_{vs}$ of the virtual sensor as a polytope structure; $A_{vsj}=A_0+\Delta A(\theta_j)-QC_f(\hat{\phi}(t))$, where $\theta_j$ represents the value of the j th vertex $\theta$; $A_{vsj}$ represents the value of the state matrix $A_{vs}$ of the virtual sensor of the j th vertex; a necessary and sufficient condition for eigenvalues of $A_{vsj}$ to be in $S_1(\rho_1, q_1, r_1, \theta_1)$ is that there exists a symmetrical matrix $X_1>0$ so that the linear matrix inequalities (18)-(20) are established, thereby obtaining a parameter matrix $Q_j$ of the virtual sensor of the corresponding vertex;

$$[A_0 + \Delta A(\theta_j) - Q_j C_f(\hat{\phi}(t))]X_1 + \tag{18}$$
$$X_1[A_0 + \Delta A(\theta_j) - Q_j C_f(\hat{\phi}(t))]^T + 2\rho_1 X_1 < 0$$

$$\begin{bmatrix} -r_1 X_1 & q_1 X_1 + \begin{bmatrix} A_0 + \Delta A(\theta_j) - \\ Q_j C_f(\hat{\phi}(t)) \end{bmatrix} X_1 \\ q_1 X_1 + X_1 \begin{bmatrix} A_0 + \Delta A(\theta_j) - \\ Q_j C_f(\hat{\phi}(t)) \end{bmatrix}^T & -r_1 X_1 \end{bmatrix} < 0 \tag{19}$$

$$\begin{cases} \sin\theta_1 \begin{cases} [A_0 + \Delta A(\theta_j) - Q_j C_f(\hat{\phi}(t))]X_1 + \\ X_1[A_0 + \Delta A(\theta_j) - Q_j C_f(\hat{\phi}(t))]^T \end{cases} \\ \cos\theta_1 \begin{cases} X_1[A_0 + \Delta A(\theta_j) - Q_j C_f(\hat{\phi}(t))]^T - \\ [A_0 + \Delta A(\theta_j) - Q_j C_f(\hat{\phi}(t))]X_1 \end{cases} \end{cases} \tag{20}$$

$$\begin{cases} \cos\theta_1 \begin{cases} [A_0 + \Delta A(\theta_j) - Q_j C_f(\hat{\phi}(t))]X_1 - \\ X_1[A_0 + \Delta A(\theta_j) - Q_j C_f(\hat{\phi}(t))]^T \end{cases} \\ \sin\theta_1 \begin{cases} [A_0 + \Delta A(\theta_j) - Q_j C_f(\hat{\phi}(t))]X_1 + \\ X_1[A_0 + \Delta A(\theta_j) - Q_j C_f(\hat{\phi}(t))]^T \end{cases} \end{cases} < 0$$

selecting $Q_j$ of a vertex corresponding to $\theta_j$ as a parameter matrix of the virtual sensor;

step 1.3.3: representing the parameter matrix P of the virtual sensor as:

$$P = C_p C_f^\dagger \tag{21}$$

where † represents pseudo-inversion of the matrix;

step 1.3.4: designing the virtual actuator as $$\dot{x}_{va}(t) = A_{va} x_{va}(t) + B_{va} \Delta u_c(t)$$

$$\Delta u(t) = M x_{va}(t) + N \Delta u_c(t)$$

$$y_c(t) = \hat{y}_f(t) + C_p x_{va}(t) \tag{22}$$

where $$A_{va} = A_0 + \Delta A(\theta) - B_f(\hat{\gamma}(t))M$$

$$B_{va} = B_0 + \Delta B(\theta) - B_f(\hat{\gamma}(t))N \tag{23}$$

where $x_{va} \in R^{n_x}$ is a state variable of the virtual actuator system; $\Delta u_c \in R^{n_x}$ is the output of the error feedback controller; $y_c \in R^{n_y}$ is an output vector of the virtual actuator system; M and N are respectively parameter matrices of the virtual actuator;

step 1.3.5: an LMI region $S_2(\rho_2, q_2, r_2, \theta_2)$ representing an intersection of a left half complex plane region with a bound of $-\rho_2$, a circular region with a radius of $r_2$ and a circle center of $q_2$ and a fan region having an intersection angle $\theta_2$ with a negative real axis; representing a state matrix $A_{va}$ of the virtual actuator as a polytope structure; $A_{vaj} = A_0 + \Delta A(\theta) - B_f(\hat{\gamma}(\theta))M_j$, where $\theta_j$ represents the value of the j th vertex $\theta$; $A_{vaj}$ represents the value of the state matrix $A_{va}$ of the virtual actuator of the j th vertex; a necessary and sufficient condition for eigenvalues of $A_{vaj}$ to be in $S_2(\rho_2, q_2, r_2, \theta_2)$ is that there exists a symmetrical matrix $X_2>0$ so that the linear matrix inequalities (24)-(26) are established, thereby obtaining a parameter matrix $M_i$ of the virtual actuator;

$$[A_0 + \Delta A(\theta_j) - B_f(\hat{\gamma}(t))M_i]X_2 + \tag{24}$$
$$X_2[A_0 + \Delta A(\theta_j) - B_f(\hat{\gamma}(t))M_i]^T + 2\rho_2 X_2 < 0$$

$$\begin{bmatrix} -r_2 X_2 & q_2 X_2 + \begin{bmatrix} A_0 + \Delta A(\theta_j) - \\ B_f(\hat{\gamma}(t))M_i \end{bmatrix} X_2 \\ q_2 X_2 + X_2 \begin{bmatrix} A_0 + \Delta A(\theta_j) - \\ B_f(\hat{\gamma}(t))M_i \end{bmatrix}^T & -r_2 X_2 \end{bmatrix} < 0 \tag{25}$$

$$\begin{cases} \sin\theta_2 \begin{cases} [A_0 + \Delta A(\theta_j) - B_f(\hat{\gamma}(t))M_i]X_2 + \\ X_2[A_0 + \Delta A(\theta_j) - B_f(\hat{\gamma}(t))M_i]^T \end{cases} \\ \cos\theta_2 \begin{cases} X_2[A_0 + \Delta A(\theta_j) - B_f(\hat{\gamma}(t))M_i]^T - \\ [A_0 + \Delta A(\theta_j) - B_f(\hat{\gamma}(t))M_i]X_2 \end{cases} \end{cases} \tag{26}$$

$$\begin{cases} \cos\theta_2 \begin{cases} [A_0 + \Delta A(\theta_j) - B_f(\hat{\gamma}(t))M_i]X_2 - \\ X_2[A_0 + \Delta A(\theta_j) - B_f(\hat{\gamma}(t))M_i]^T \end{cases} \\ \sin\theta_2 \begin{cases} [A_0 + \Delta A(\theta_j) - B_f(\hat{\gamma}(t))M_i]X_2 + \\ X_2[A_0 + \Delta A(\theta_j) - B_f(\hat{\gamma}(t))M_i]^T \end{cases} \end{cases} < 0$$

selecting $M_j$ of a vertex corresponding to $\theta_j$ as a parameter matrix of the virtual actuator;

step 1.3.6: representing the parameter matrix N of the virtual actuator as:

$$N = B_f^\dagger B_p \tag{27}$$

where † represents pseudo-inversion of the matrix;

step 1.4: designing an interval error observer according to the aircraft engine LPV model having disturbance and actuator and sensor faults and the reference model of the system with fault;

step 1.4.1: representing the reference model of the aircraft engine system having disturbance and actuator and sensor faults as:

$$\dot{x}_{ref}(t) = A_0 x_{ref}(t) + B_f(\hat{\gamma}(t)) u_{ref}(t)$$

$$y_{ref}(t) = C_f(\hat{\phi}(t)) x_{ref}(t) \tag{28}$$

where $x_{ref} \in R^{n_x}$ is a reference state vector of the system having disturbance and actuator and sensor faults; $u_{ref} \in R^{n_x}$ is control input of the system having disturbance and actuator and sensor faults; $y_{ref} \in R^{n_y}$ is a reference output vector of the system having disturbance and actuator and sensor faults;

step 1.4.2: defining an error $e(t) = x_{ref}(t) - x_f(t)$ between the aircraft engine LPV model having disturbance and actuator and sensor faults and the reference model of the aircraft engine to obtain error state equations of the system with fault of the aircraft engine based on the LPV model:

$$\dot{e}(t) = [A_0 + \Delta A(\theta)]e(t) + B_f(\hat{\gamma})\Delta u(t) - B_f(\Delta \gamma)u_f(t) - \Delta A(\theta)x_{ref}(t) - d_f(t)$$

$$\varepsilon_c(t) = C_f(\hat{\phi}(t))e(t) - C_f(\Delta \phi)x_{ref}(t) - v(t) \tag{29}$$

where $\Delta u(t)$ and $\varepsilon_c(t)$ represent the input and output difference between the reference model and faulty aircraft engine LPV model with $\Delta u(t) = u_{ref}(t) - u_f(t)$ and $\varepsilon_c(t) = y_{ref}(t) - y_f(t)$;

step 1.4.3: representing state equations of an upper bound $\overline{e}$ and a lower bound $\underline{e}$ of the error $\underline{e}$ between the aircraft engine LPV model having disturbance and actuator and sensor faults and the reference model of the aircraft engine as:

$$\bar{e}(t)=[A_0-LC_f(\phi(t))]\bar{e}(t)+[B_0+\overline{\Delta B}]\Delta u_c(t)+L[\varepsilon_c(t)+C_p x_{va}+(C_p-PC_f(\phi(t)))x_{vs}]+|L|V-\underline{d}(t)+\overline{\Delta A}|x_{ref}(t)|+\overline{\Delta B}|u_{ref}|+\bar{\phi}(t)$$

$$\underline{\dot{e}}(t)=[A_0-LC_f(\phi(t))]\underline{e}(t)+[B_0-\overline{\Delta B}]\Delta u_c(t)+L[\varepsilon_c(t)+C_p x_{va}+(C_p-PC_f(\phi(t)))x_{vs}]-|L|V-\underline{d}(t)-\overline{\Delta A}|x_{ref}(t)|-\overline{\Delta B}|u_{ref}|-\underline{\phi}(t) \quad (30)$$

where $\phi(t)=\overline{\Delta A}(\bar{e}_v^+(t)+\underline{e}_v^-(t))$, $e_v$ is a difference among the error state variable of the system with fault of the aircraft engine based on the LPV model, the state variable of the virtual actuator and the state variable of the virtual sensor; the upper bound of $e_v$ is $\bar{e}_v(t)=\bar{e}(t)-x_{va}(t)-x_{vs}(t)$; the lower bound of $e_v$ is $\underline{e}_v(t)=\underline{e}(t)-x_{va}(t)-x_{vs}(t)$; $A_0-LC_f \in M^{n_x \times n_x}$;

step 1.4.4: setting $e_a=0.5(\bar{e}+\underline{e})$, $e_d=\bar{e}-\underline{e}$, and obtaining the interval error observer from (30);

$$\dot{e}_d(t)=[A_0-LC_f(\phi(t))]e_d(t)+2\overline{\Delta B}\Delta u_c(t)+\phi_d(t)+\delta_d(t)$$

$$\dot{e}_a(t)=[A_0-LC_f]e_a(t)+B_0 K_a E_a(t)+B_0 K_d E_d(t)+\delta_a(t)+LC_p x_{va}+L(C_p-PC_f)+LC_f e(t) \quad (31)$$

where $\phi_d$, $\delta_d(t)$ and $\delta_a(t)$ represent equivalent range of $e_v$, range of the interval of external disturbance v(t) and d(t), and middle value of the interval of external disturbance v(t) and d(t), respectively;

$$\phi_d(t)=2\overline{\Delta A}(\bar{e}_v^+(t)+\underline{e}_v^-(t))$$

$$\delta_d(t)=2|L|V-\underline{d}(t)+\bar{d}(t)+2\Delta A|x_{ref}(t)|2\Delta B|u_{ref}(t)|$$

$$\delta_a(t)=-Lv(t)-0.5(\underline{d}(t)+\bar{d}(t)) \quad (32)$$

step 1.5: using the aircraft engine state variable $x_f(t)$ of the aircraft engine LPV model having disturbance and actuator and sensor faults, the output variable $y_f(t)$, the reference model state variable $x_{ref}(t)$ of the system with fault, the virtual actuator state variable $x_{va}(t)$ and the virtual sensor state variable $x_{va}(t)$ as inputs of the interval error observer; using the interval error observer output $e_a(t),e_d(t)$ as the input of the error feedback controller; using the error feedback controller output $\Delta u_c(t)$ as the input of the virtual actuator; inputting the difference between the reference model output $u_{ref}(t)$ of the system with fault and the virtual actuator output $\Delta u(t)$ as a control signal into the system with fault of the aircraft engine, thereby realizing active fault tolerant control of the aircraft engine.

Compared with the existing technology, the interval error observer-based aircraft engine active fault tolerant control method designed by the present invention has the advantages:

(1) In the active fault tolerant control of the LPV system having actuator and sensor faults, the traditional gain self-scheduling H-infinite optimization method is often used. The method readjusts the controller parameters when the system has the fault, thereby increasing the complexity of the system design. The active fault tolerant control method proposed by the present invention can reconfigure the system which simultaneously has actuator and sensor faults without redesigning the controller.

(2) When the system has actuator faults and sensor faults, the method proposed by the present invention can enable the reconfigured system to have the same state and output as the original fault-free system.

(3) The method proposed by the present invention considers the problem that often appears in the noise signal interference of the control system in actual engineering, and improves the robustness of the control system.

DETAILED DESCRIPTION

The embodiments of the present invention will be further described in detail below in combination with the drawings and the technical solution.

Figure 1:
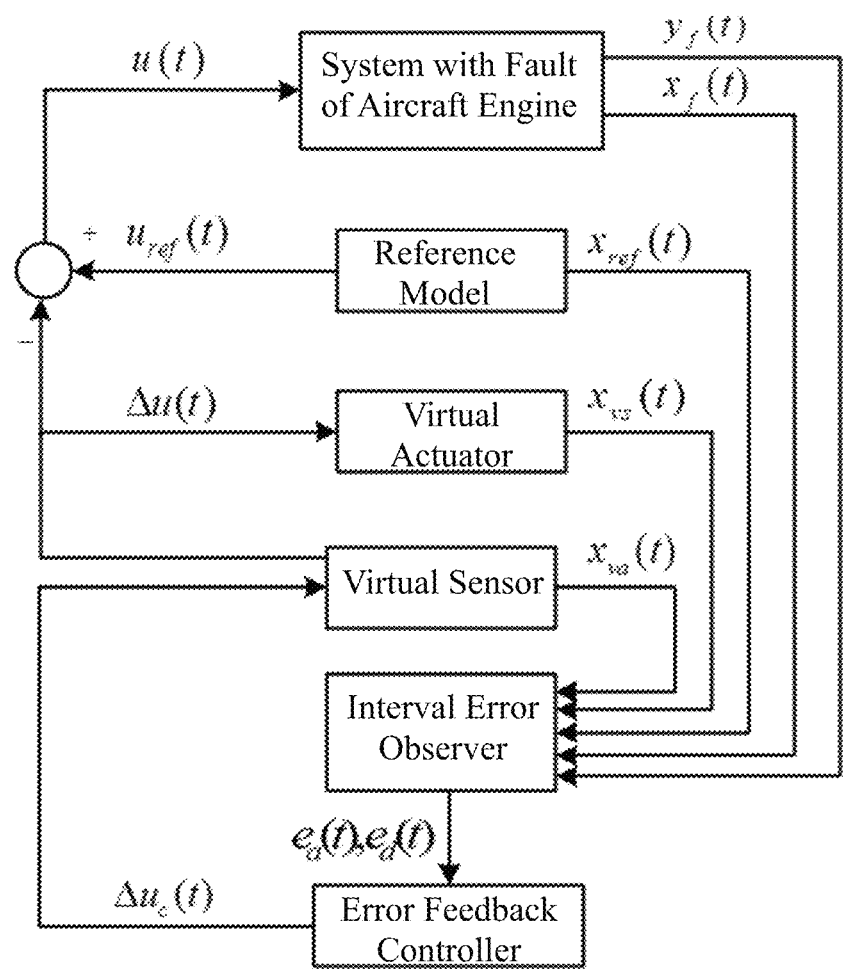
FIG. 1 is an overall structural diagram of a system.

The overall structure of the present invention is shown in FIG. 1, and comprises the following specific steps:

step 1.1: establishing an affine parameter-dependent aircraft engine LPV model; and taking relative conversion speed $n_2$ of a high pressure rotor of the aircraft engine as a variable parameter $\theta$ to normalizing the speed $n_2$=88%, 89%, ... ,100%, i.e., $\theta \in [-1,1]$, to obtain a model:

$$\dot{x}_p = [A_0 + \Delta A(\theta)]x_p(t) + [B_0 + \Delta B(\theta)]u_p(t) + d_f(t) \quad (33)$$

$$y_p = C_p x_p(t) + v(t)$$

where $$A_0 = \begin{bmatrix} -2.6748 & -0.6877 \\ 1.0704 & -4.4672 \end{bmatrix}, \Delta A(\theta) = \begin{bmatrix} 0.5199\theta & -2.4061\theta \\ 0.1049\theta & -0.8365\theta \end{bmatrix} \quad (34)$$

$$B_0 = \begin{bmatrix} 0.0033 \\ 0.0012 \end{bmatrix}, \Delta B(\theta) = \begin{bmatrix} -0.0004\theta \\ -0.0001\theta \end{bmatrix}$$

-continued $$C_p = [0 \ 1]$$

the state variable initial value is $x_p(0)=[0, 0]^T$; the upper bound and the lower bound of a disturbance variable $d_f(t)$ are $\underline{d}, \overline{d} \in R^{n_x}$;

$$\overline{d} = -\underline{d} = \begin{bmatrix} 0.001 \\ 0.001 \end{bmatrix};$$

and the sensor noise bound is V=0.01. $\Delta A(\theta)$ and $\Delta B(\theta)$ have established $-\overline{\Delta A} \leq \Delta A(\theta) \leq \overline{\Delta A}$ and $-\overline{\Delta B} \leq \Delta B(\theta) \leq \overline{\Delta B}$.

$$\overline{\Delta A} = \begin{bmatrix} 0.5199 & 2.4061 \\ 0.1049 & 0.8365 \end{bmatrix}, \overline{\Delta B} = \begin{bmatrix} 0.0004 \\ 0.0001 \end{bmatrix} \quad (35)$$

Figure 2A:
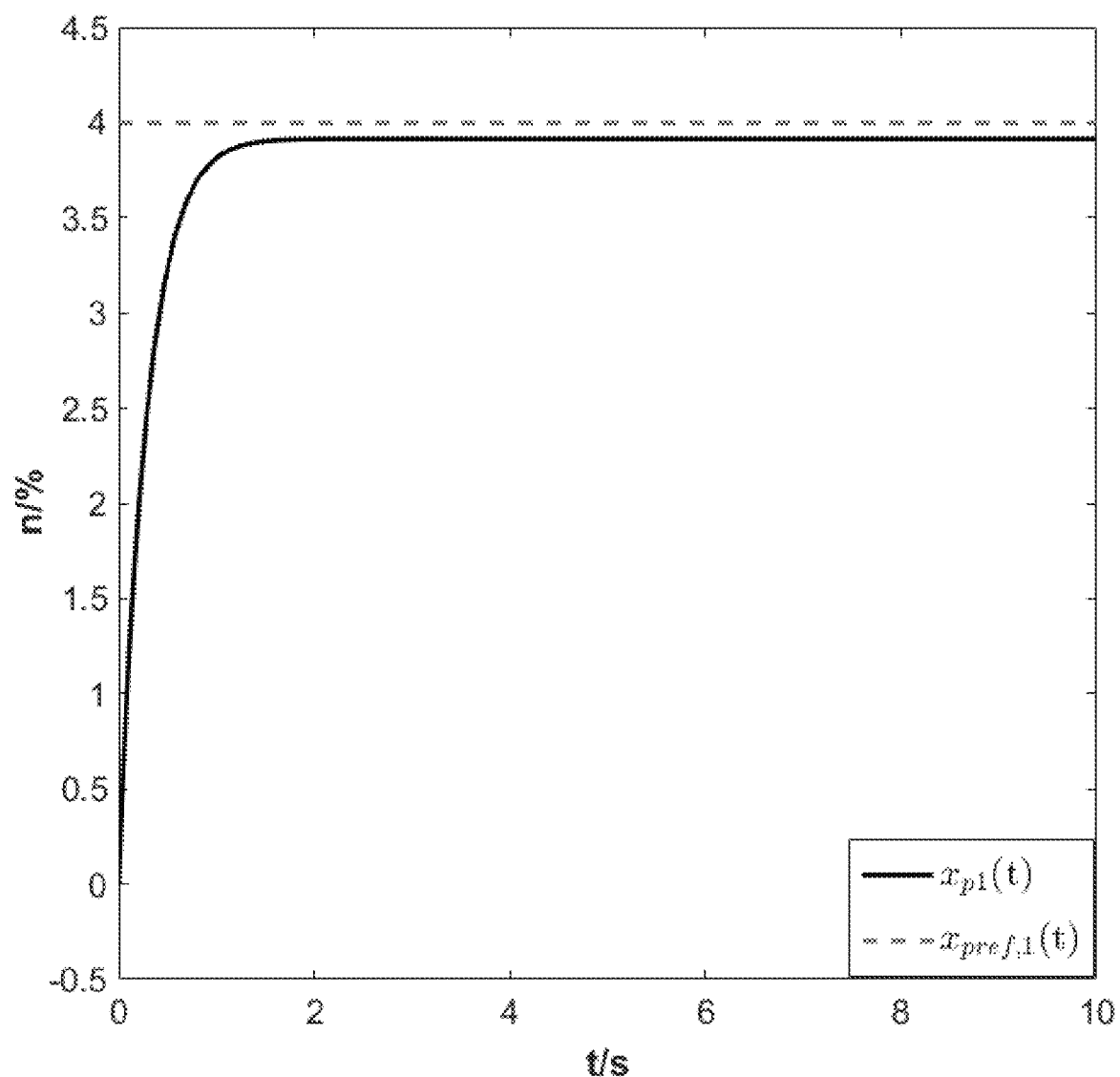
FIG. 2(a) and FIG. 2(b) are respectively contrasts of trajectories of H=0, Ma=0, $n_2$=94% aircraft engine LPV model states $x_{p1}(t)$ and $x_{p2}(t)$ and trajectories of fault-free reference model states $x_{pref,1}(t)$ and $x_{pref,2}(t)$.
Figure 2B:
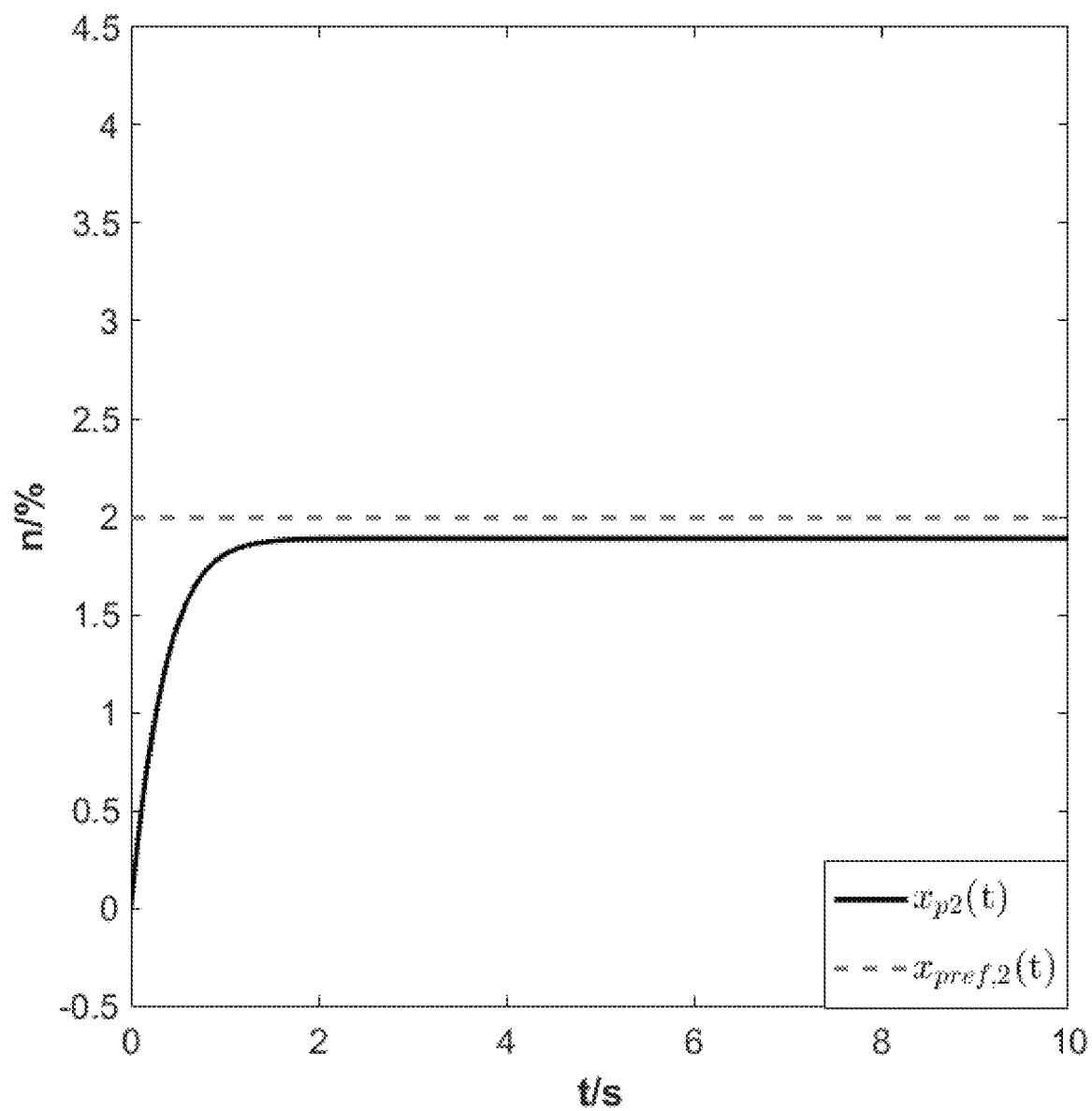
Figure 3:
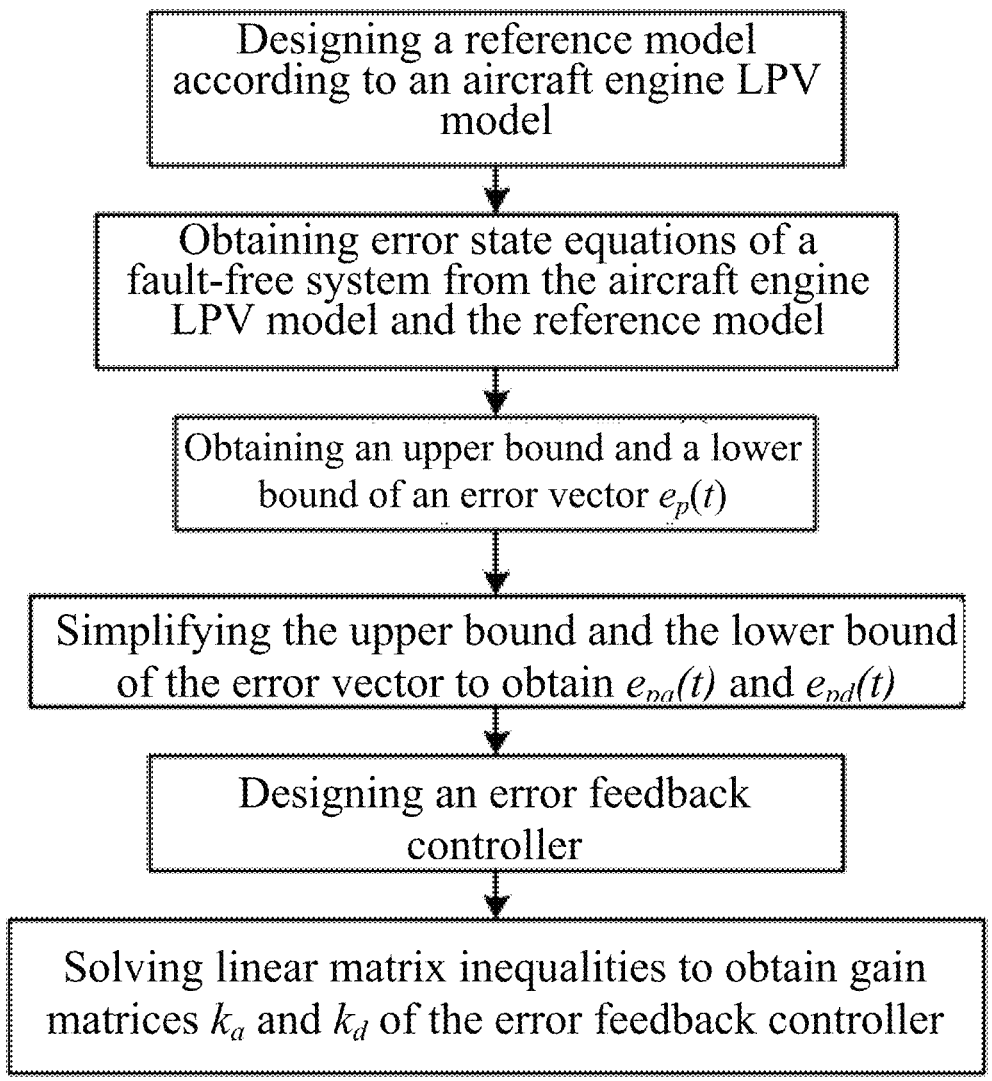
FIG. 3 is a flow chart of an error feedback controller algorithm.

Step 1.2: representing the reference model of the fault-free system of the aircraft engine as $$L = \begin{bmatrix} -5 \\ 20 \end{bmatrix} \quad (38)$$

where the state vector of the reference model is a constant value $x_{pref}(t)=[4, 2]^T$. At H=0, Ma=0 and $n_2$=94%, contrasts of trajectories of aircraft engine LPV model states $x_{p1}(t)$ and $x_{p2}(t)$ and trajectories of fault-free reference model states $x_{pref,1}(t)$ and $x_{pref,2}(t)$ are shown in FIG. 2. An error feedback controller of a fault-free system of the aircraft engine is designed, and an algorithm flow of the error feedback controller is shown in FIG. 3.

Step 1.2.1: defining an error $e_p(t)=x_{pref}-x_{pref,2}$ between the affine parameter-dependent aircraft engine LPV model and the reference model of the fault-free system of the aircraft engine, with an initial value is $e_p(0)=x_{pref}(0)-x_p(0)=[4, 2]^T$.

Figure 4A:
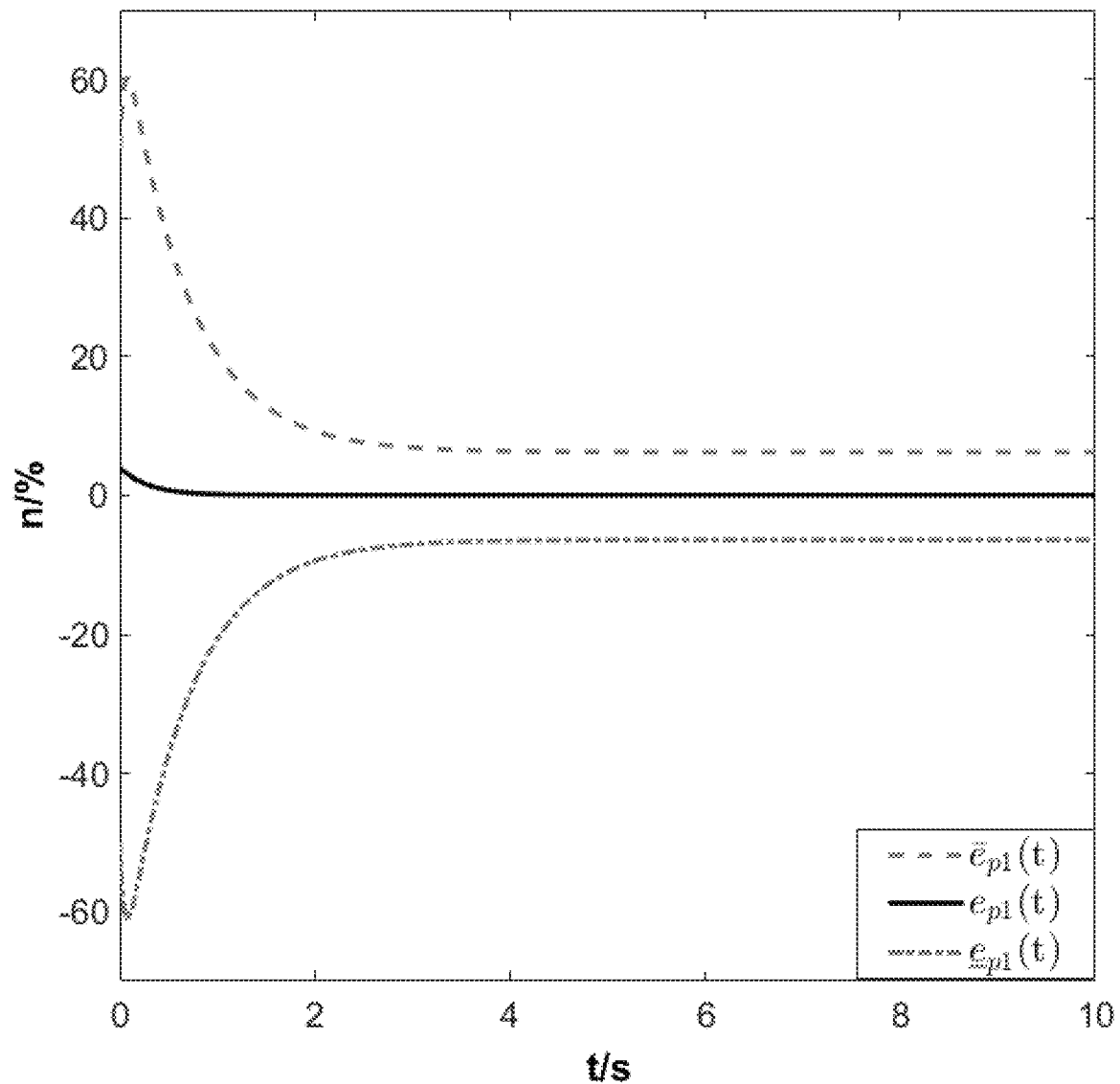
FIG. 4(a) and FIG. 4(b) are respectively the estimated curves of error states $e_{p1}(t)$ and $e_{p2}(t)$, upper bound states $\bar{e}_{p1}(t)$ and $\bar{e}_{p2}(t)$ and lower bound states $\underline{e}_{p1}(t)$ and $\underline{e}_{p2}(t)$ of H=0, Ma=0, $n_2$=94% aircraft engine fault-free system.
Figure 4B:
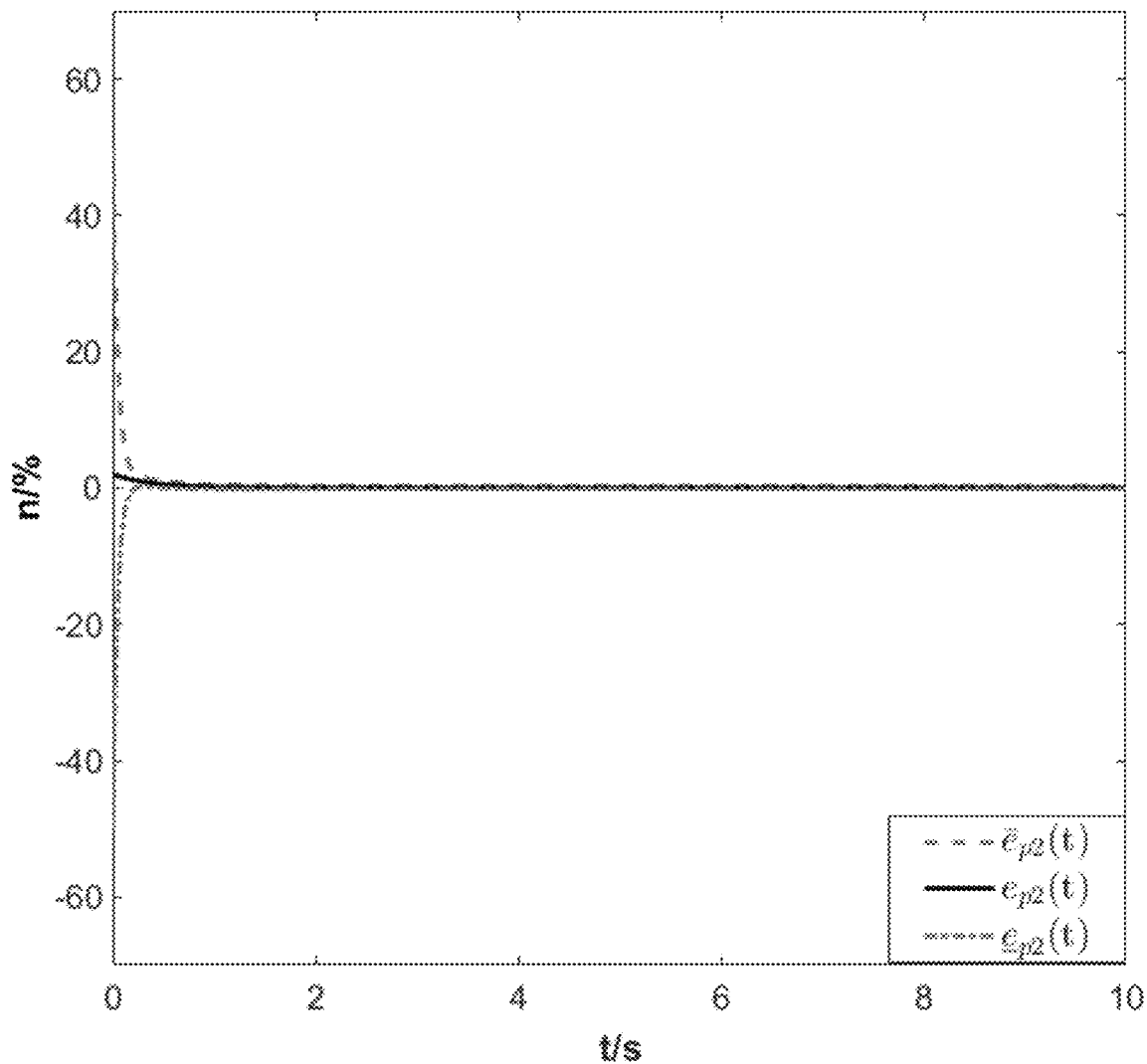

Step 1.2.2: representing state equations of the upper bound $\overline{e}_p$ and the lower bound of the error vector $\underline{e}_p$ as:

$$\dot{\overline{e}}_p(t)=[A_0-LC_p]\overline{e}_p(t)+[B_0+\overline{\Delta B}]\Delta u_{cp}(t)+L\varepsilon_{cp}(t)+|L|V-\underline{d}(t)+\overline{\Delta A}|x_{pref}(t)|+\phi_p(t)$$

$$\dot{\underline{e}}_p(t)=[A_0-LC_p]\underline{e}_p(t)+[B_0-\overline{\Delta B}]\Delta u_{cp}(t)+L\varepsilon_{cp}(t)-|L|V-\overline{d}(t)-\overline{\Delta A}|x_{pref}(t)|-\phi_p(t) \quad (37)$$

where $\underline{e}_p(0)=[-50,-50]^T$, $\overline{e}_p(0)=[50,50]^T$ and $\phi_p(t)=\overline{\Delta A}(\overline{e}_p^+(t)+\underline{e}_p^-(t))$. At H=0, Ma=0 and $n_2$=94%, the estimated curves of error states $e_{p1}(t)$ and $e_{p2}(t)$, upper bound $\overline{e}_{p1}(t)$ and $\overline{e}_{p2}(t)$ and lower bound $\underline{e}_{p1}(t)$ and $\underline{e}_{p2}(t)$ of aircraft engine fault-free system are shown in FIG. 4. From $A_0-LC_p \in M^{n_x \times n_r}$, the error gain matrix of the fault-free system can be obtained Step 1.2.3: respectively setting $e_{pa}=0.5(\overline{e}_p+\underline{e}_p)$, $e_{pd}=\overline{e}_p-\underline{e}_p$ to obtain $$\dot{e}_{pd}(t)=[A_0-LC_p]e_{pd}(t)+2\overline{\Delta B}\Delta u_{cp}(t)+\phi_{pd}(t)+\delta_{pd}(t)$$

$$\dot{e}_{pa}(t)=[A_0-LC_p]e_{pa}(t)+B_0K_a e_{pa}(t)+B_0K_d e_{pd}(t)+LC_p e_p(t)+\delta_{pa}(t)$$

$$\phi_{pd}(t)=2\overline{\Delta A}(\overline{e}_p^+(t)+\underline{e}_p^-(t))$$

$$\delta_{pd}(t)=2|L|V-\underline{d}(t)+\overline{d}(t)+2\Delta A|x_{pref}(t)|$$

$$\delta_{pa}(t)=-Lv(t)-0.5(\underline{d}(t)+\overline{d}(t)) \quad (39)$$

where $\overline{e}_{p1}$ and $\underline{e}_{p1}$ ($\overline{e}_{p2}$ and $\underline{e}_{p2}$) respectively represent the first (second) element of $\overline{e}_p$ and $\underline{e}_p$, and $e_{x,1}$ and $e_{x,2}$ respectively represent the first element and the second element of $e_x$.

$$2(\overline{e}_{p1}^+ + \underline{e}_{p1}^-) = \begin{cases} 2\overline{e}_{p1} = e_{pd,1} + 2e_{pa,1} & \overline{e}_{p1} \geq 0, \underline{e}_{p1} \geq 0 \\ 2(\overline{e}_{p1} - \underline{e}_{p1}) = 2e_{pd,1} & \overline{e}_{p1} \geq 0, \underline{e}_{p1} < 0 \\ -2\underline{e}_{p1} = e_{pd,1} - 2e_{pa,1} & \overline{e}_{p1} < 0, \underline{e}_{p1} < 0 \end{cases} \quad (40)$$

$$2(\overline{e}_{p2}^+ + \underline{e}_{p2}^-) = \begin{cases} 2\overline{e}_{p2} = e_{pd,2} + 2e_{pa,2} & \overline{e}_{p2} \geq 0, \underline{e}_{p2} \geq 0 \\ 2(\overline{e}_{p2} - \underline{e}_{p2}) = 2e_{pd,2} & \overline{e}_{p2} \geq 0, \underline{e}_{p2} < 0 \\ -2\underline{e}_{p1} = e_{pd,2} - 2e_{pa,2} & \overline{e}_{p2} < 0, \underline{e}_{p2} < 0 \end{cases}$$

Step 1.2.4: representing the output of the error feedback controller as $$\Delta u_{cp}(t)=K_a e_{pa}(t)+K_d e_{pd}(t) \quad (41)$$

representing the gain matrix of the error feedback controller as $K_d, K_a \in R^{n_x \times n_x}$; setting $$e_x(t) = e_p(t) - e_{pa}(t), -0.5e_{pd}(t) \leq e_x(t) \leq 0.5e_{pd}(t), \text{ and then} \quad (42)$$

$$\dot{e}_{pa}(t) = [A_0 + B_0 K_a]e_{pa}(t) + B_0 K_d e_{pd}(t) + LC_p e_x(t) + \delta_{pa}(t)$$

Step 1.2.5: rewriting (39) and (42) as $$\dot{\xi}_p(t) = G_p(t)\xi_p(t) + \delta_p(t)$$

$$G_p(t) = \begin{bmatrix} A_0 - LC_p & 0 \\ B_0 K_d & A_0 + B_0 K_a \end{bmatrix} + A_{pd}(t)$$

where $$\xi_p(t) = [e_{pd}(t)^T, e_{pa}(t)^T]^T \delta_p(t) = [(\delta_{pd}(t) + 2\overline{\Delta B}\Delta u_{cp}(t))^T, \delta_{pa}(t)^T]^T,$$

and then $$\begin{bmatrix} \phi_{pd} \\ LC_p e_x \end{bmatrix} = A_{pd} \begin{bmatrix} e_{pd} \\ e_{pa} \end{bmatrix} \quad (45)$$

$$2\overline{\Delta A}(\overline{e}_p^+(t) + \underline{e}_p^-(t)) = A_{pd1} \begin{bmatrix} e_{pd} \\ e_{pa} \end{bmatrix}, LC_p e_x = A_{pd2} \begin{bmatrix} e_{pd} \\ e_{pa} \end{bmatrix}$$

$$A_{pd1} = \overline{\Delta A} \begin{bmatrix} a_{11} & 0 & a_{13} & 0 \\ 0 & a_{22} & 0 & a_{24} \end{bmatrix}, A_{pd2} = \begin{bmatrix} 0 & a_{31} & 0 & 0 \\ 0 & a_{41} & 0 & 0 \end{bmatrix}$$

$$A_{pd} = \begin{bmatrix} A_{pd1} \\ A_{pd2} \end{bmatrix}$$

All possible combining forms are considered: $(a_{11},a_{13}) \in \{(1,2),(2,0),(1,-2)\}$, $(a_{22},a_{24}) \in \{(1,2),(2,0),(1,-2)\}$ and $(a_{31},a_{41}) \in \{(-2.5,10),(2.5,-10)\}$.

Step 1.2.6: $S^{m \times m}$ representing an m-dimensional real symmetric square matrix; setting a matrix $E,F \in S^{2n_x \times 2n_x}$; $E,F > 0$ representing that each element in $E,F$ is greater than 0; constant $\lambda > 0$; and obtaining a matrix inequality:

$$G_p^T E + EG_p + \lambda E + F < 0 \quad (46)$$

namely, setting each element in $G_p^T E + EG_p + \lambda E + F$ to be less than 0; converting the matrix inequality (46) to a linear matrix inequality (LMI), and multiplying the left and right sides of the inequality (46) by to obtain $$E^1 G_p^T + G_p E^1 + \lambda E^1 + F_p < 0 \quad (47)$$

$$G_p(t) = \begin{bmatrix} A_0 - LC_p & 0 \\ 0 & A_0 \end{bmatrix} + A_{pd}(t) + \begin{bmatrix} 0 \\ B_0 \end{bmatrix} K \quad (48)$$

$$K = [K_d \quad K_a]$$

introducing $W = KE^{-1}$, and then converting inequality (46) into the LMI; using an LMI tool kit to obtain $$K_d = [-0 \ 0.0014 \ -0.0002]$$

$$K_a = [-14.5130 \ -21.8837]$$

Figure 5:
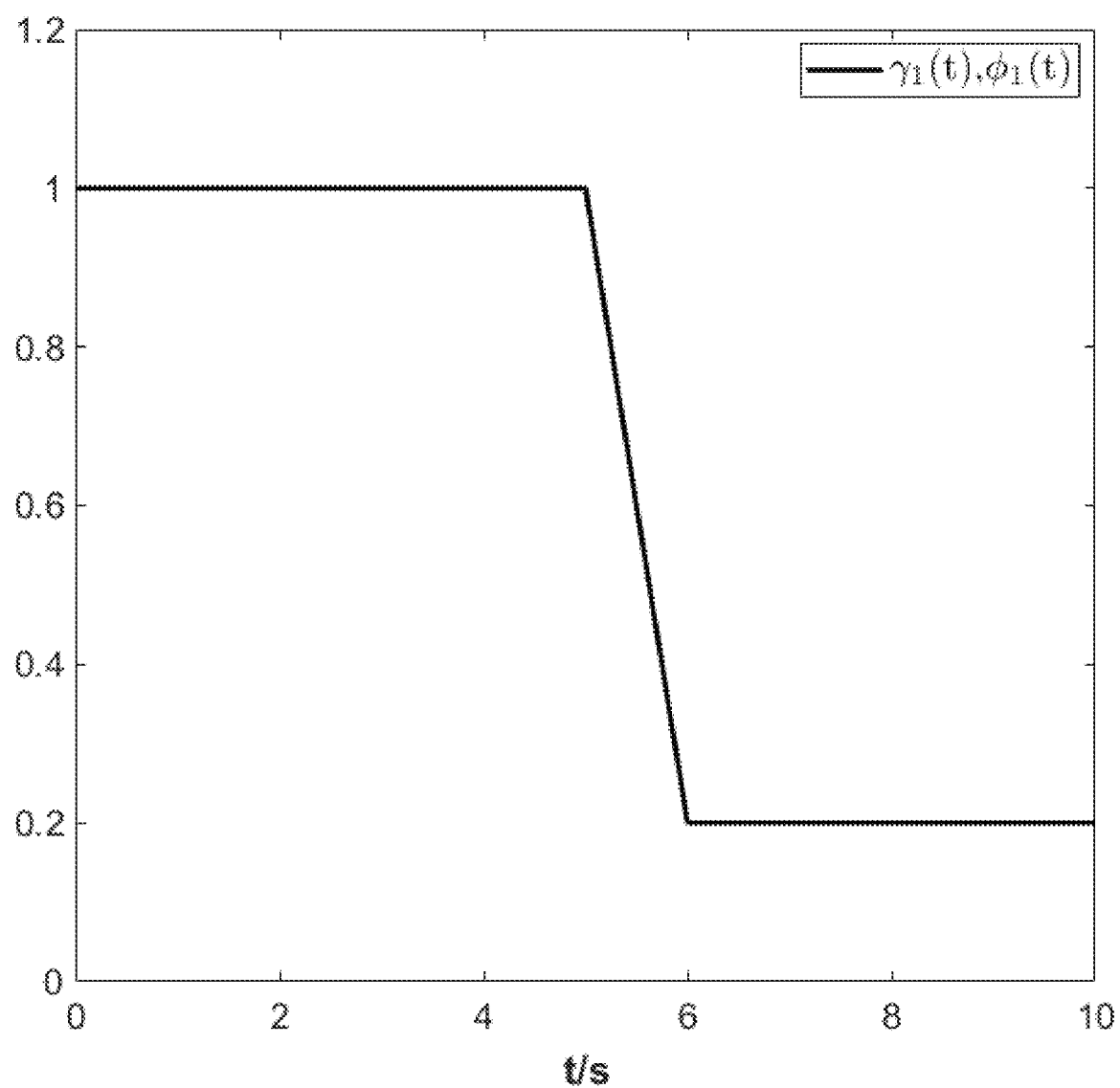
FIG. 5 is a varying curve of an actuator fault factor $\gamma_i$ and a sensor fault factor $\phi_1$.
Figure 6A:
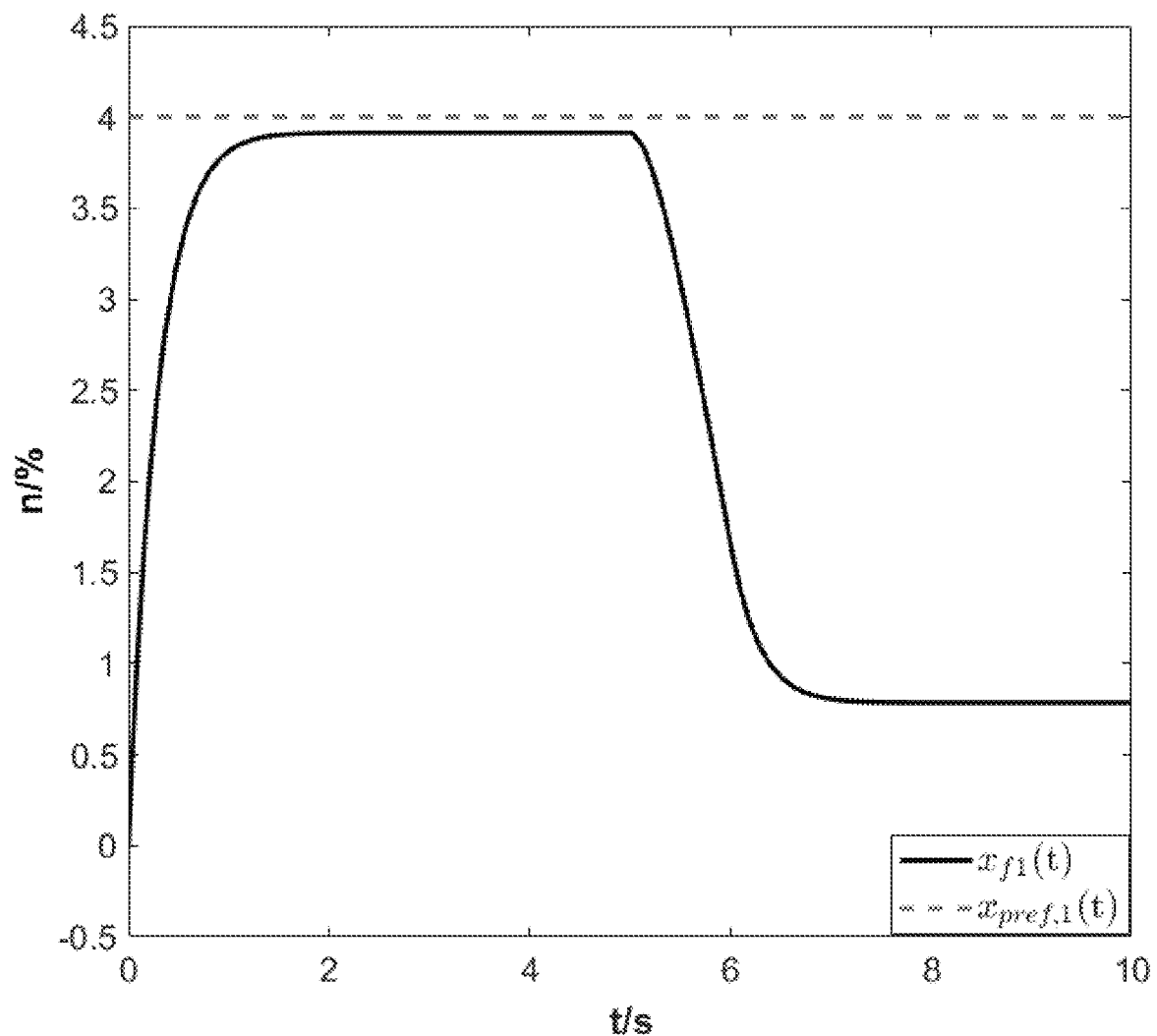
FIG. 6(a) and FIG. 6(b) are respectively the contrasts of trajectories of aircraft engine states $x_{f1}(t)$ and $x_{f2}(t)$ at H=0, Ma=0, $n_2$=94% under both disturbances and actuator and sensor faults, and trajectories of fault-free reference model states $x_{pref,1}(t)$ and $x_{pref,2}(t)$.
Figure 6B:
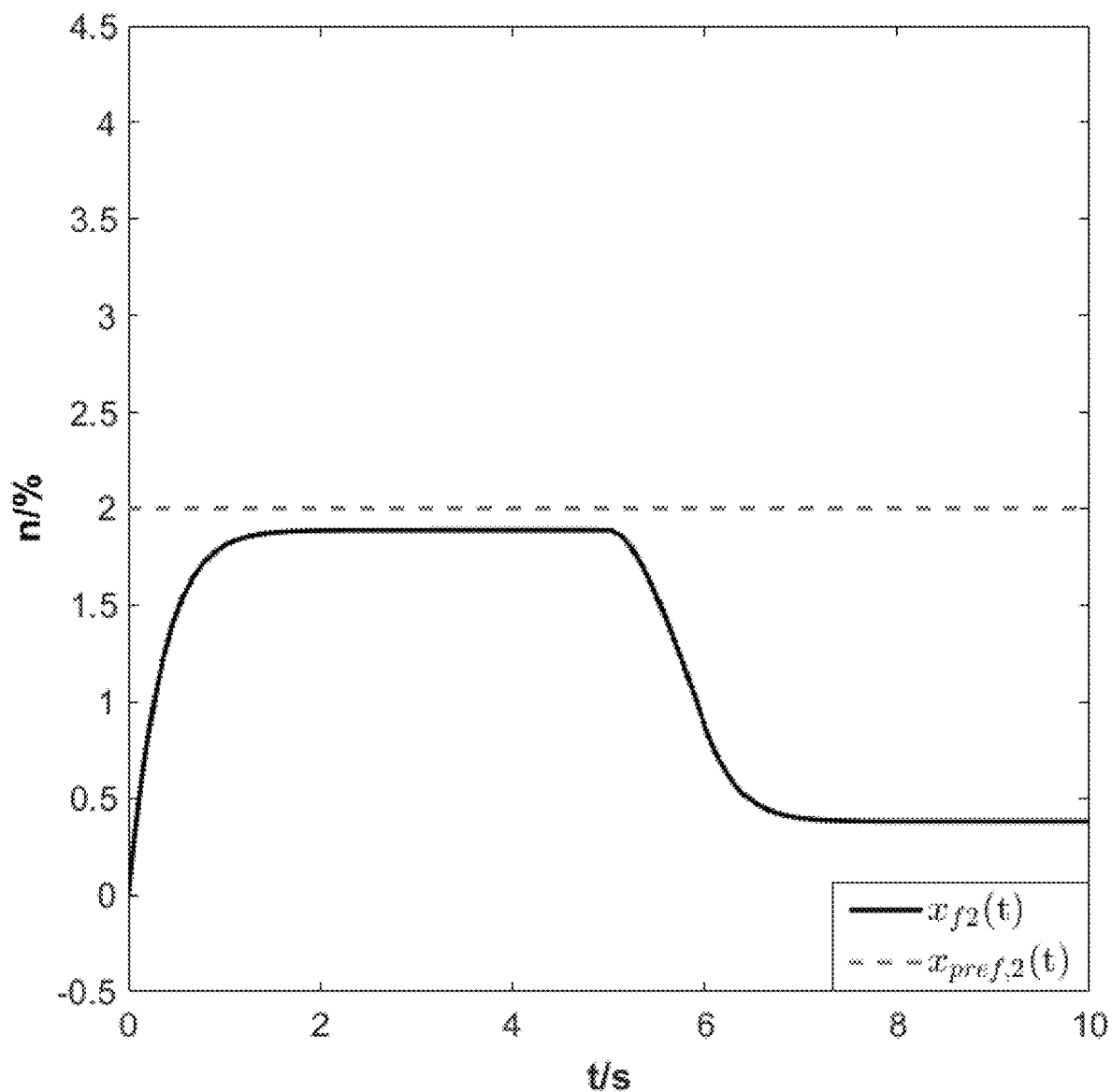
Figure 7A:
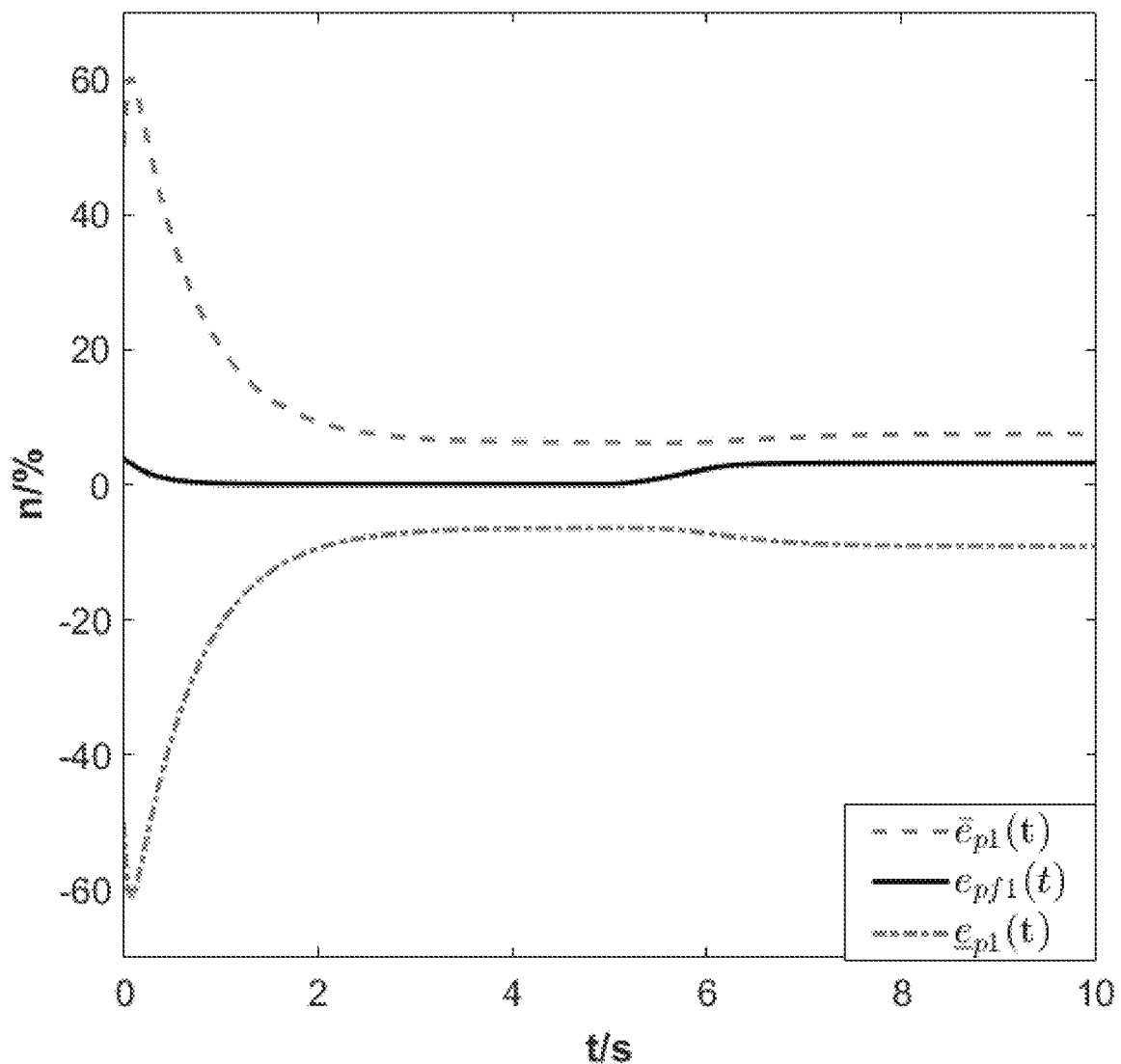
FIG. 7(a) and FIG. 7(b) are respectively the estimated curves of aircraft engine error states $e_{pf1}(t)$ and $e_{pf2}(t)$, upper bound states $\bar{e}_{p1}(t)$ and $\bar{e}_{p2}(t)$ and lower bound states $\underline{e}_{p1}(t)$ and $\underline{e}_{p2}(t)$ at H=0, Ma=0, $n_2$=94% under both disturbances and actuator and sensor faults.
Figure 7B:
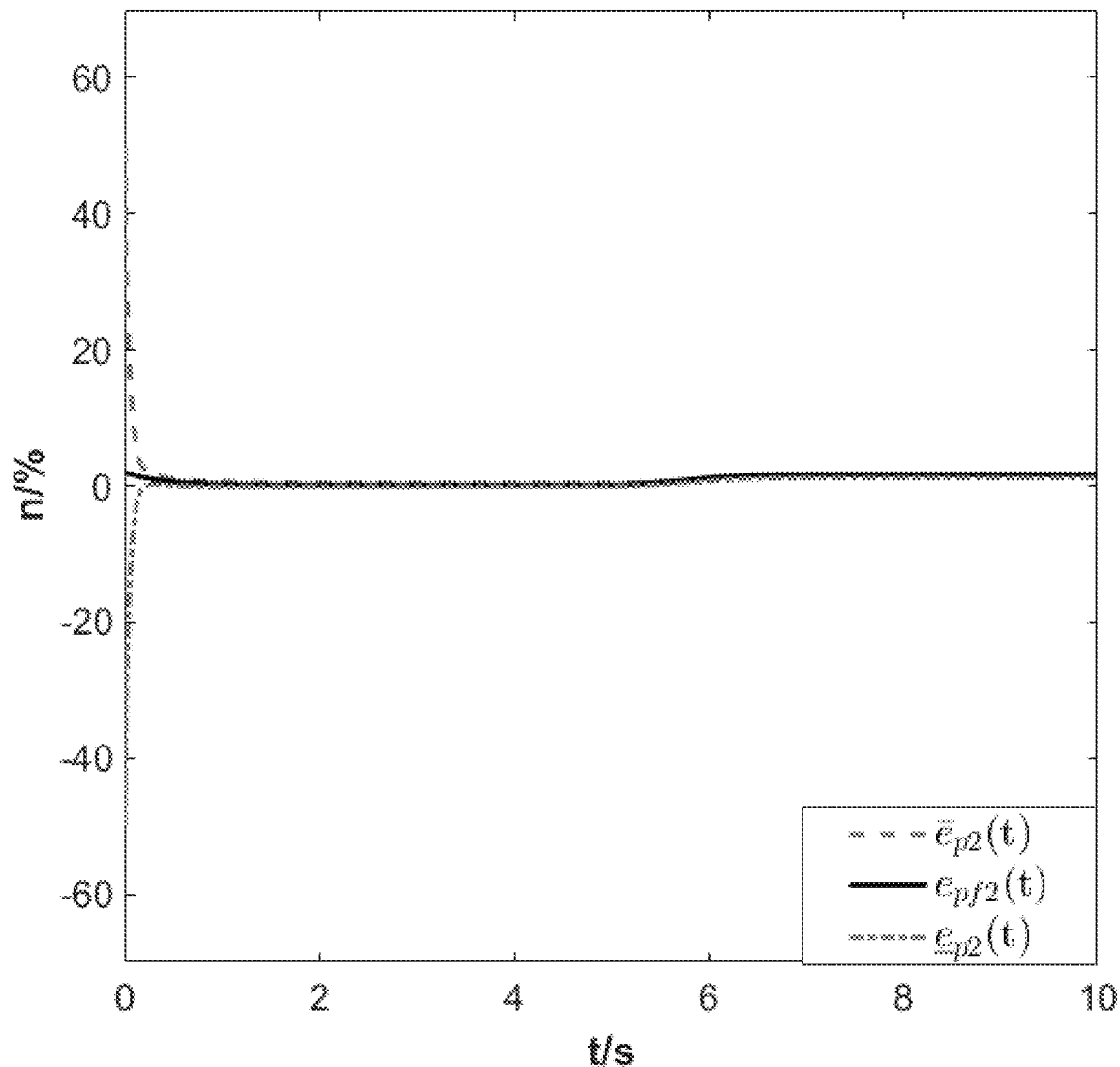
Figure 8:
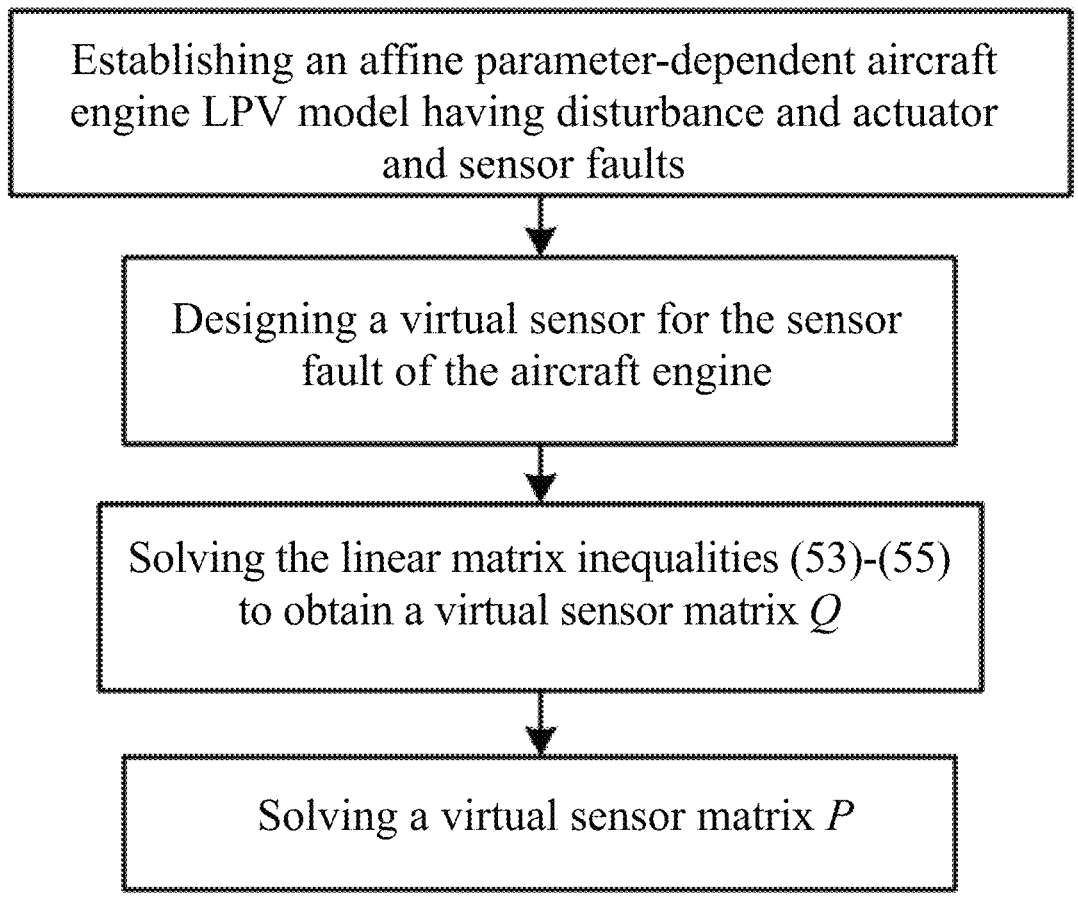
FIG. 8 is a flow chart of a virtual sensor algorithm.
Figure 9:
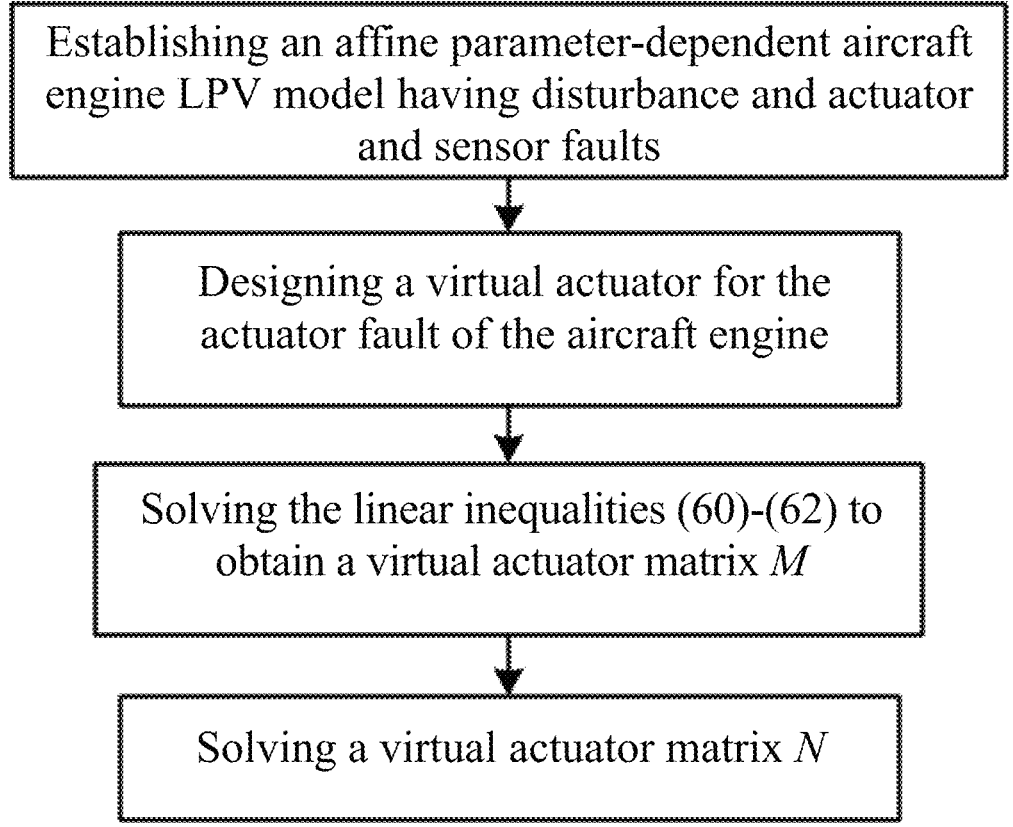
FIG. 9 is a flow chart of a virtual actuator algorithm.

Step 1.3: describing the aircraft engine LPV model having disturbance and actuator and sensor faults as:

$$\dot{x}_f(t) = [A_0 + \Delta A(\theta)] x_f(t) + B_f(\gamma(t)) u_f(t) + d_f(t)$$

$$y_f(t) = C_f(\phi(t)) x_f(t) + v(t)$$

$$B_f(\gamma(t)) = [B_0 + \Delta B(\theta)] \mathrm{diag}(\gamma_1(t), \ldots, \gamma_n(t))$$

$$C_f(\phi(t)) = C_p \ \mathrm{diag}(\phi_1(t), \ldots, \phi_n(t)) \quad (50)$$

where state variable initial values $x_f(\theta) = [0, 0]^T$, $B_f(\gamma(t))$ and $C_f(\phi(t))$ are respectively actuator and sensor faults; and the actuator fault factor $\gamma_1$ and the sensor fault factor $\phi_1$ decay from 1 to 0.2 in the 5th to 6th seconds, as shown in FIG. 5. At H=0, Ma=0 and $n_2$=94%, contrasts of trajectories of states $x_{f1}(t)$ and $x_{f2}(t)$ of the aircraft engine having disturbance and actuator and sensor faults and trajectories of fault-free reference model states $x_{pref,1}(t)$ and $x_{pref,2}(t)$ are shown in FIG. 6. Estimated curves of error states $e_{pf1}(t)$ and $e_{pf2}(t)$ and upper bounds $\bar{e}_{p1}(t)$ and $\bar{e}_{p2}(t)$ and lower bounds $\underline{e}_{p1}(t)$ and $\underline{e}_{p2}(t)$ of the aircraft engine having disturbance and actuator and sensor faults are shown in FIG. 7. A virtual sensor and a virtual actuator are respectively designed according to the actuator and sensor faults, and algorithm flows are respectively shown in FIG. 8 and FIG. 9.

Step 1.3.1: designing the virtual sensor as $$\dot{x}_{vs}(t) = A_{vs}(\theta) x_{vs}(t) + B_f(\hat{\gamma}(t)) \Delta u(t) + Q y_f(t)$$

$$\hat{\gamma}_f(t) = C_{vs} x_{vs}(t) + P y_f(t) \quad (51)$$

where $$A_{vs}(\theta) = A_0 + \Delta A(\theta) - Q C_f(\hat{\phi}(t))$$

$$C_{vs} = C_p - P C_f(\hat{\phi}(t)) \quad (52)$$

where $x_{vs} \in R^{n_x}$ is a state variable of a virtual sensor system; $\Delta u \in R^{n_x}$ is a difference in inputs of a fault model and a fault reference model; $\gamma_f \in R^{n_y}$ is an output vector of the virtual sensor system; Q and P are respectively parameter matrices of the virtual sensor.

Step 1.3.2: selecting an LMI region $S_1(10, -4.5, 15, \pi/6)$ and solving LMIs (53)-(55)

$$[A_0 + \Delta A(\theta_j) - Q_j C_f(\hat{\phi}(t))] X_1 + \quad (53)$$

$$X_1 [A_0 + \Delta A(\theta_j) - Q_j C_f(\hat{\phi}(t))]^T + 2\rho_1 X_1 < 0$$

$$\begin{bmatrix} -r_1 X_1 & q_1 X_1 + \begin{bmatrix} A_0 + \Delta A(\theta_j) - \\ Q_j C_f(\hat{\phi}(t)) \end{bmatrix} X_1 \\ q_1 X_1 + X_1 \begin{bmatrix} A_0 + \Delta A(\theta_j) - \\ Q_j C_f(\hat{\phi}(t)) \end{bmatrix}^T & -r_1 X_1 \end{bmatrix} < 0 \quad (54)$$

$$\begin{cases} \sin\theta_1 \left\{ \begin{bmatrix} [A_0 + \Delta A(\theta_j) - Q_j C_f(\hat{\phi}(t))] X_1 + \\ X_1 [A_0 + \Delta A(\theta_j) - Q_j C_f(\hat{\phi}(t))]^T \end{bmatrix} \right\} \\ \cos\theta_1 \left\{ \begin{bmatrix} X_1 [A_0 + \Delta A(\theta_j) - Q_j C_f(\hat{\phi}(t))]^T - \\ [A_0 + \Delta A(\theta_j) - Q_j C_f(\hat{\phi}(t))] X_1 \end{bmatrix} \right\} \\ \cos\theta_1 \left\{ \begin{bmatrix} [A_0 + \Delta A(\theta_j) - Q_j C_f(\hat{\phi}(t))] X_1 - \\ X_1 [A_0 + \Delta A(\theta_j) - Q_j C_f(\hat{\phi}(t))]^T \end{bmatrix} \right\} \\ \sin\theta_1 \left\{ \begin{bmatrix} [A_0 + \Delta A(\theta_j) - Q_j C_f(\hat{\phi}(t))] X_1 + \\ X_1 [A_0 + \Delta A(\theta_j) - Q_j C_f(\hat{\phi}(t))]^T \end{bmatrix} \right\} \end{cases} < 0 \quad (55)$$

obtaining a parameter matrix of a virtual sensor of a corresponding vertex $$Q_1 = [-15.4224; \ 24.4935]$$

$$Q_2 = [8.5894; \ 33.1359] \quad (56)$$

Step 1.3.3: representing the parameter matrix P of the virtual sensor as $$P = C_p C_f^\dagger \quad (57)$$

where † represents pseudo-inversion of the matrix;
step 1.3.4: designing the virtual actuator as $$\dot{x}_{va}(t) = A_{va} x_{va}(t) + B_{va} \Delta u_c(t)$$

$$\Delta u(t) = M x_{va}(t) + N \Delta u_c(t)$$

$$y_c(t) = \hat{y}_f(t) + C_p x_{va}(t) \quad (58)$$

where $$A_{va} = A_0 + \Delta A(\theta) - B_f(\hat{\gamma}(t)) M$$

$$B_{va} = B_0 + \Delta B(\theta) - B_f(\hat{\gamma}(t)) N \quad (59)$$

where $x_{va} \in R^{n_x}$ is a state variable of the virtual actuator system; $\Delta u_c \in R^{n_x}$ is the output of the error feedback controller; $y_c \in R^{n_y}$ is an output vector of the virtual actuator system; M and N are respectively parameter matrices of the virtual actuator;

Step 1.3.5: selecting an LMI region $S_2(1.5, -2, 8, \pi/6)$ and solving LMIs (60)-(62)

$$[A_0 + \Delta A(\theta_j) - B_f(\hat{\gamma}(t)) M_i] X_2 + \quad (60)$$

$$X_2 [A_0 + \Delta A(\theta_j) - B_f(\hat{\gamma}(t)) M_i]^T + 2\rho_2 X_2 < 0$$

$$\begin{bmatrix} -r_2 X_2 & q_2 X_2 + \begin{bmatrix} A_0 + \Delta A(\theta_j) - \\ B_f(\hat{\gamma}(t)) M_i \end{bmatrix} X_2 \\ q_2 X_2 + X_2 \begin{bmatrix} A_0 + \Delta A(\theta_j) - \\ B_f(\hat{\gamma}(t)) M_i \end{bmatrix}^T & -r_2 X_2 \end{bmatrix} < 0 \quad (61)$$

$$\begin{cases} \sin\theta_2 \left\{ \begin{bmatrix} [A_0 + \Delta A(\rho(t)) - B_f(\hat{\gamma}(t)) M_i] X_2 + \\ X_2 [A_0 + \Delta A(\rho(t)) - B_f(\hat{\gamma}(t)) M_i]^T \end{bmatrix} \right\} \\ \cos\theta_2 \left\{ \begin{bmatrix} X_2 [A_0 + \Delta A(\rho(t)) - B_f(\hat{\gamma}(t)) M_i]^T - \\ [A_0 + \Delta A(\rho(t)) - B_f(\hat{\gamma}(t)) M_i] X_2 \end{bmatrix} \right\} \\ \cos\theta_2 \left\{ \begin{bmatrix} [A_0 + \Delta A(\rho(t)) - B_f(\hat{\gamma}(t)) M_i] X_2 - \\ X_2 [A_0 + \Delta A(\rho(t)) - B_f(\hat{\gamma}(t)) M_i]^T \end{bmatrix} \right\} \\ \sin\theta_2 \left\{ \begin{bmatrix} [A_0 + \Delta A(\rho(t)) - B_f(\hat{\gamma}(t)) M_i] X_2 + \\ X_2 [A_0 + \Delta A(\rho(t)) - B_f(\hat{\gamma}(t)) M_i]^T \end{bmatrix} \right\} \end{cases} < 0 \quad (62)$$

obtaining a parameter matrix of a virtual actuator of a corresponding vertex $$M_1=[3690.6 \ -4333.2]$$

$$M_2=[2170.5 \ 2186.6] \quad (63)$$

Step 1.3.6: representing the matrix N of the virtual actuator as $$N=B_f^\dagger B_P=5 \quad (64)$$

Figure 10:
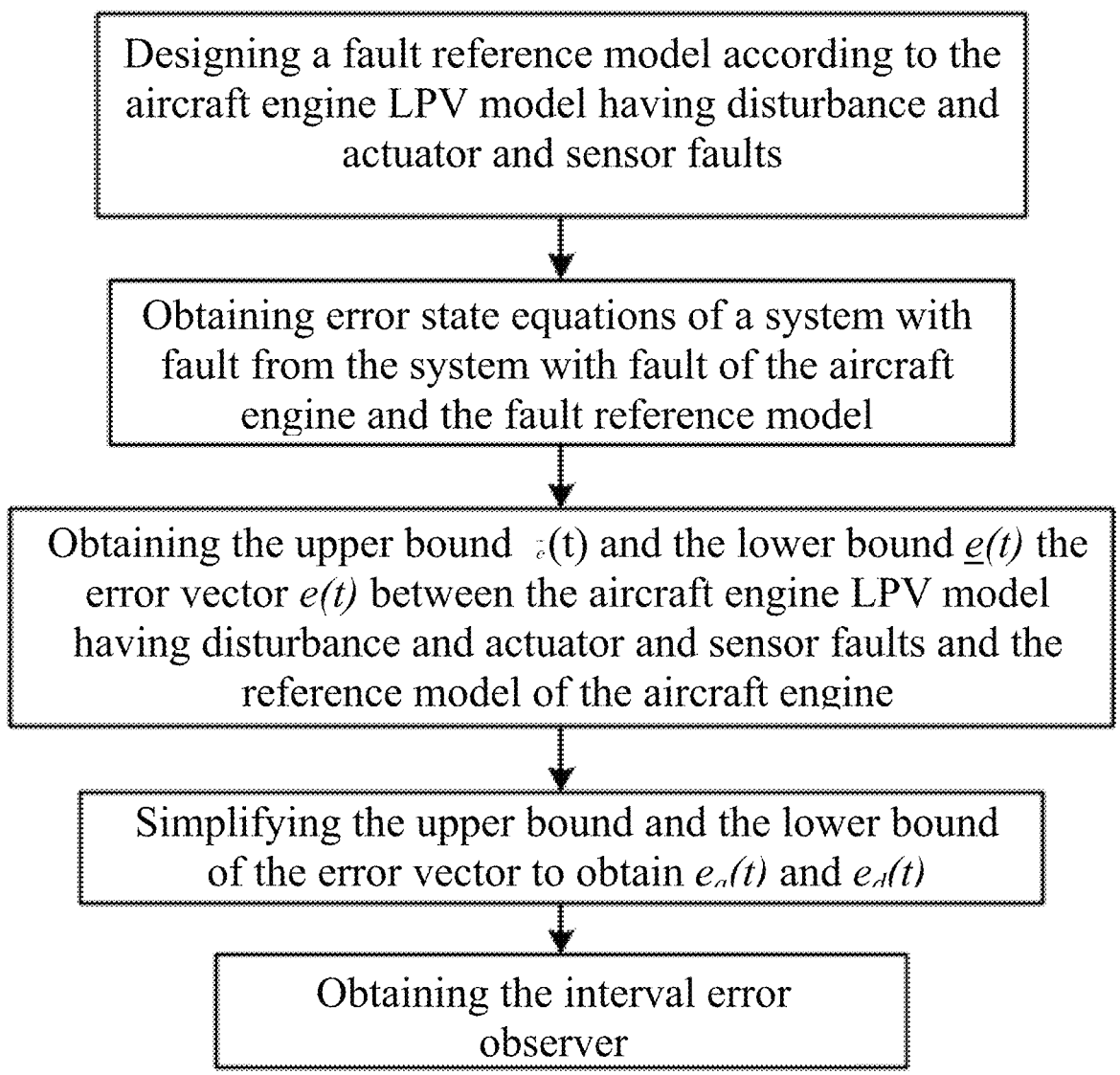
FIG. 10 is a flow chart of an interval error observer algorithm.

Step 1.4: designing an interval error observer, wherein an algorithm flow of the interval error observer is shown in FIG. 10.

Step 1.4.1: representing the reference model of the aircraft engine system having disturbance and actuator and sensor faults as $$\dot{x}_{ref}(t)=A_0 x_{ref}(t)+B_f(\hat{\gamma}(t))u_{ref}(t)$$

$$y_{ref}(t)=C_f(\hat{\phi}(t))x_{ref}(t) \quad (65)$$

where the state vector of the reference model is a constant value $x_{ref}(t)=[4,2]^T$.

Figure 11A:
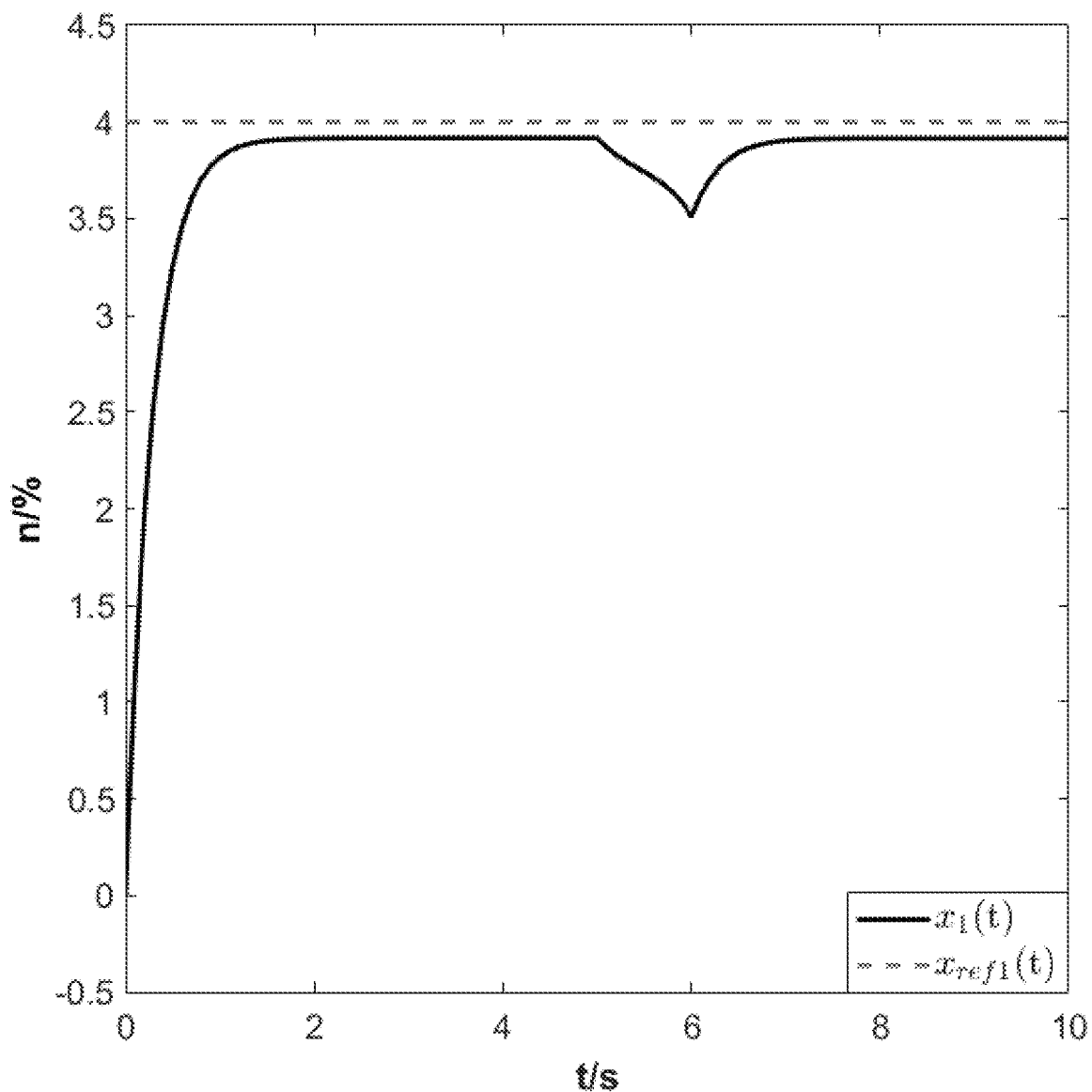
FIG. 11(a) and FIG. 11(b) are respectively the contrasts of trajectories of aircraft engine states $x_1(t)$ and $x_2(t)$ at H=0, Ma=0, $n_2$=94% after active fault tolerant control and trajectories of fault reference model states $x_{ref,1}(t)$ and $x_{ref,2}(t)$.
Figure 11B:
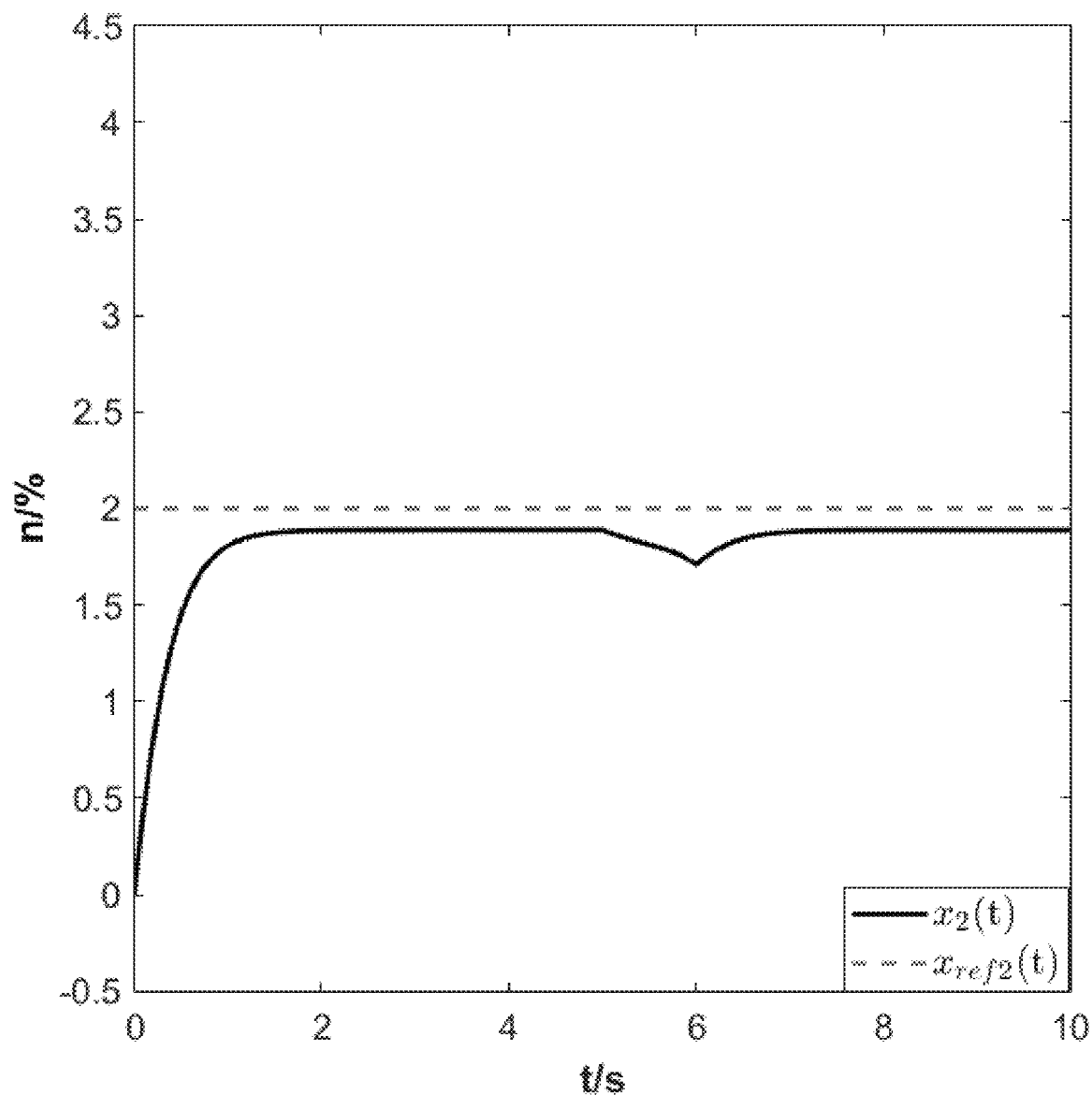

Step 1.4.2: defining an error $e(t)=x_{ref}-x_f$ between the aircraft engine LPV model having disturbance and actuator and sensor faults and the reference model of the aircraft engine with an initial value of the error $e(0)=x_{ref}(0)-x_f(0)=[4,2]^T$. At H=0, Ma=0 and $n_2$=94%, the contrasts of trajectories of aircraft engine states $x_1(t)$ and $x_2(t)$ and trajectories of fault reference model states $x_{ref,1}(t)$ and $x_{ref,2}(t)$ after active fault tolerant control are shown in FIG. 11.

Step 1.4.3: representing state equations of an upper bound $\bar{e}$ and a lower bound $\underline{e}$ of the error e between the aircraft engine LPV model having disturbance and actuator and sensor faults and the reference model of the aircraft engine as $$\dot{\bar{e}}(t)=[A_0-LC_f(\phi(t))]\bar{e}(t)+[B_0+\overline{\Delta B}]\Delta u_c(t)+L[\varepsilon_c(t)+C_p x_{va}+(C_p-PC_f(\phi(t)))x_{vs}]+|L|V-\underline{d}(t)+\overline{\Delta A}|x_{ref}(t)|+\overline{\Delta B}|u_{ref}|+\phi(t)$$

$$\dot{\underline{e}}(t)=[A_0-LC_f(\phi(t))]\underline{e}(t)+[B_0-\overline{\Delta B}]\Delta u_c(t)+L[\varepsilon_c(t)+C_p x_{va}+(C_p-PC_f(\phi(t)))x_{vs}]-|L|V-\bar{d}(t)-\overline{\Delta A}|x_{ref}(t)|-\overline{\Delta B}|u_{ref}|-\phi(t) \quad (66)$$

where $\phi(t)=\overline{\Delta A}(\bar{e}_v^+(t)+\underline{e}_v^-(t))$, $\underline{e}_v(t)=\bar{e}(t)-x_{va}(t)-x_{vs}(t)$, $\underline{e}_v(0)=[-50,-50]^T$ and $\bar{e}_v(0)=[50,50]^T$. $\underline{e}_v(t)=\underline{e}(t)-x_{va}(t)-x_{vs}(t)$. The gain matrix L of the observer satisfies $A_0-LC_p \in M^{n_x \times n_x}$.

Step 1.4.4: setting $e_a=0.5(\bar{e}+\underline{e})$, $e_d=\bar{e}-\underline{e}$, and obtaining the interval error observer from (66)

$$\dot{e}_d(t)=[A_0-LC_f(\phi(t))]e_d(t)+2\overline{\Delta B}\Delta u_c(t)+\phi_d(t)+\delta_d(t)$$

$$\dot{e}_a(t)=[A_0-LC_f]e_a(t)+B_0K_d E_a(t)+B_0K_d E_d(t)+\delta_a(t)+LC_p x_{va}+L(C_p-PC_f)+LC_f e(t) \quad (67)$$

where $$\phi_d(t)=2\overline{\Delta A}(\bar{e}_v^+(t)+\underline{e}_v^-(t))$$

$$\delta_d(t)=2|L|V-\underline{d}(t)+\bar{d}(t)+2\Delta A|x_{pref}(t)|2\Delta B|u_{pref}(t)|$$

$$\delta_a(t)=-Lv(t)-0.5(\underline{d}(t)+\bar{d}(t)) \quad (68)$$

Figure 12A:
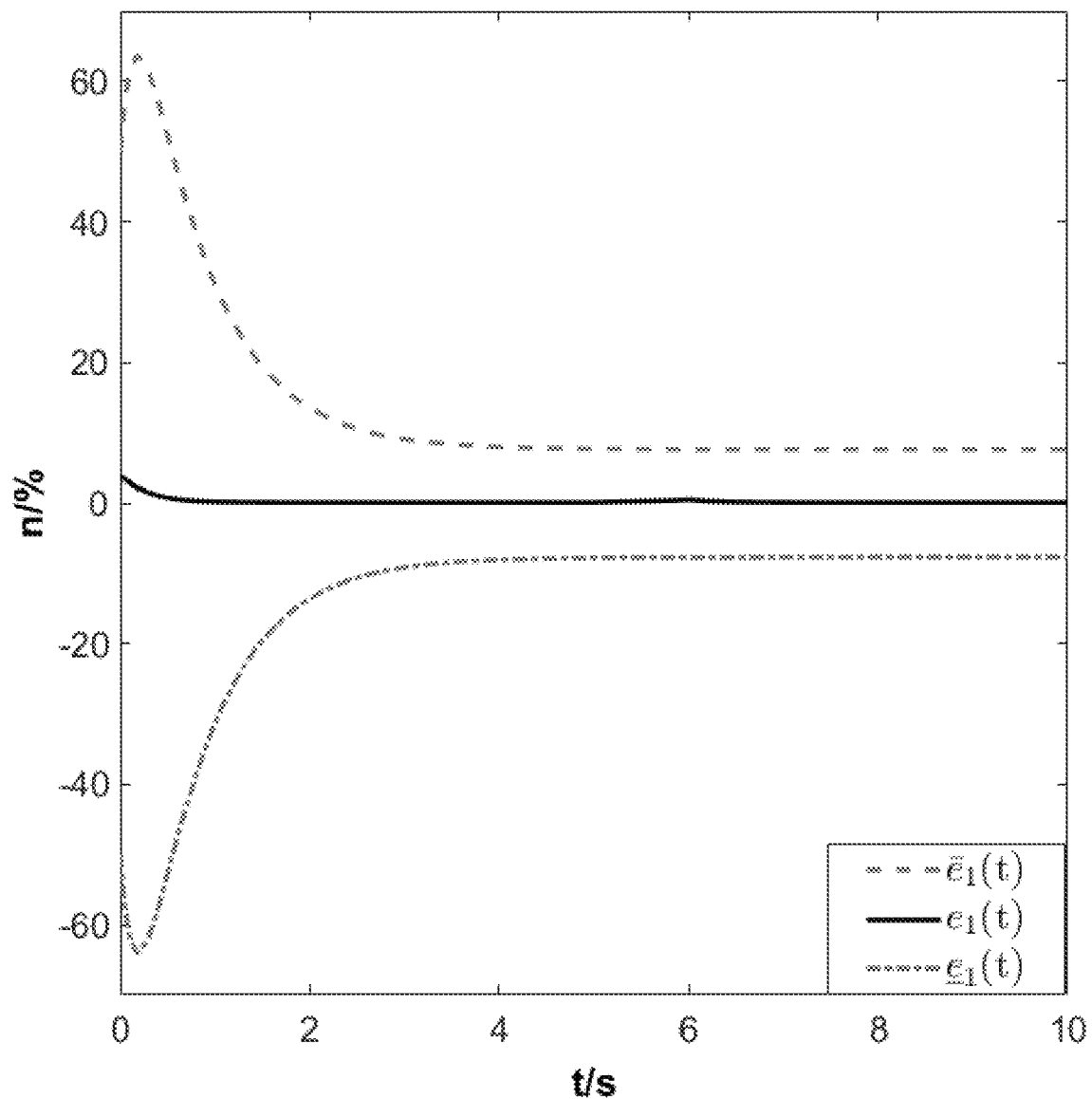
FIG. 12(a) and FIG. 12(b) are respectively the estimated curves of aircraft engine error states $e_1(t)$ and $e_2(t)$, and upper bound states $\bar{e}_1(t)$ and $\bar{e}_2(t)$ and lower bound states $\underline{e}_1(t)$ and $\underline{e}_2(t)$ of an error observer at H=0, Ma=0, $n_2$=94% after active fault tolerant control.
Figure 12B:
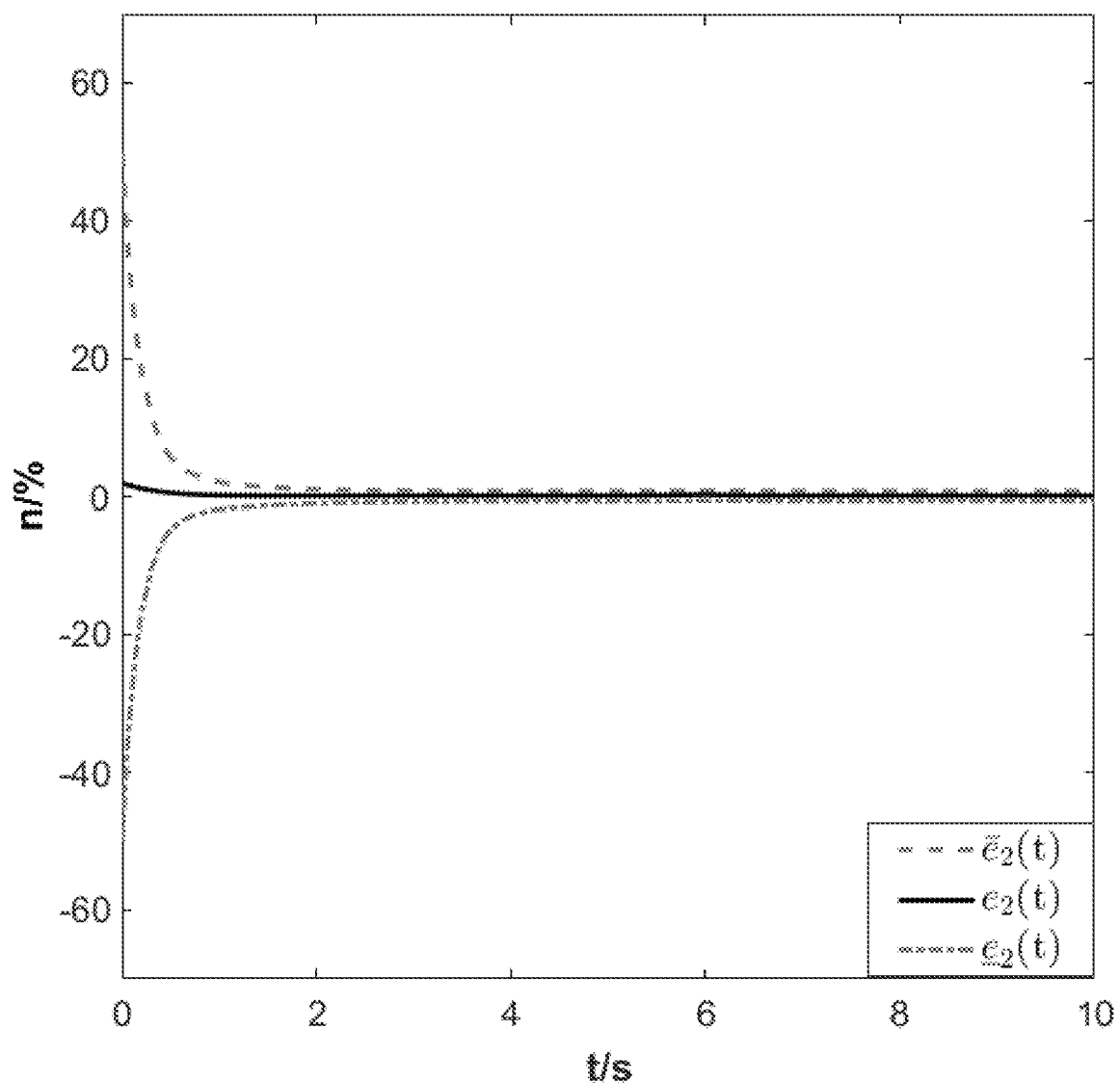

At H=0, Ma=0 and $n_2$=94%, estimated curves of aircraft engine error states $e_1(t)$ and $e_2(t)$, and upper bound states $\bar{e}_1(t)$ and $\bar{e}_2(t)$ and lower bound states $\underline{e}_1(t)$ and $\underline{e}_2(t)$ of an error observer after active fault tolerant control are shown in FIG. 12.

Step 1.5: showing the overall structure that realizes the active fault tolerant control of the aircraft engine in FIG. 1.

Simulation results show that when the actuator and the sensor of the aircraft engine fail, an overshooting process occurs in states and outputs after active fault tolerant control, but the actuator and the sensor quickly return to a normal state. This indicates that the interval error observer-based aircraft engine active fault tolerant control method can ensure that the reconfigured system has the same performance criteria as the original fault-free system.

The invention claimed is:

1. An interval error observer-based aircraft engine active fault tolerant control method for a controller of an aircraft engine, comprising the following steps:

step 1.1: establishing an affine parameter-dependent aircraft engine linear-parameter-varying LPV model $$\dot{x}_p(t)=[A_0+\Delta A(\theta)]x_p(t)+[B_0+\Delta B(\theta)]u_p(t)+d_f(t)$$

$$y_p(t)=C_p x_p(t)+v(t) \quad (1)$$

where $R^m$ and $R^{m \times n}$ respectively represent a m-dimensional real number column vector and a m-row n-column real matrix; state vectors $x_p=[Y_{nl} \ Y_{nh}]^T \in R^{n_x}$, $Y_{nl}$ and $Y_{nh}$ respectively represent variation of relative conversion speed of low pressure and high pressure rotors; $n_x$ represents the dimension of a state variable x; $n_y$ represents the dimension of an output vector y; $n_u$ represents the dimension of control input $u_p$; control input $u_p=U_{Pf} \in R^{n_x}$ is a fuel pressure step signal; output vectors $y_p=Y_{nh} \in R^{n_y}$, $A_0 \in R^{n_x \times n_x}$, $B_0 \in R^{n_x \times n_x}$ and $C_p \in R^{n_y \times n_x}$ are known system constant matrices; $d_f(t)$ is a disturbance variable; the relative conversion speed $n_h$ of the high pressure rotor of the aircraft engine is a scheduling parameter $\theta \in R^p$; system variable matrices $\Delta A(\theta)$ and $\Delta B(\theta)$ satisfy $-\overline{\Delta A} \leq \Delta A(\theta) \leq \overline{\Delta A}$ and $-\overline{\Delta B} \leq \Delta B(\theta) \leq \overline{\Delta B}$; $\overline{\Delta A} \in R^{n_x \times n_x}$ is an upper bound of $\Delta A(\theta)$; $\overline{\Delta B} \in R^{n_x \times n_u}$ is an upper bound of $\Delta B(\theta)$; $\overline{\Delta A} \geq 0$, $\overline{\Delta B} \geq 0$; a state variable initial value $x_p(0)$ satisfies $\underline{x}_0 \leq x_p(0) \leq \bar{x}_0$; $\bar{x}_0, \underline{x}_0 \in R^{n_x}$ are respectively known upper bound and lower bound of the state variable initial value $x_p(0)$; $\bar{d}, \underline{d} \in R^{n_x}$ are known upper bound and lower bound of an unknown disturbance $d_f(t)$; sensor noise v(t) satisfies $|v(t)|<V$; V is a known bound; V>0;

step 1.2: defining reference model of fault-free system of the aircraft engine (1) as $$\dot{x}_{pref}(t)=A_0 x_{pref}(t)+B_0 u_{pref}(t)$$

$$y_{pref}(t)=C_p x_{pref}(t) \quad (2)$$

where $x_{pref} \in R^{n_x}$ is a reference state vector of the fault-free system; $u_{pref} \in R^{n_x}$ is control input of the fault-free system; $y_{pref} \in R^{n_y}$ is a reference output vector; an error feedback controller of the fault-free system of the aircraft engine is designed according to the aircraft engine LPV model established in the step 1.1;

step 1.2.1: defining an error $e_p(t)=x_{pref}(t)-x_p(t)$ between the affine parameter-dependent aircraft engine LPV model and the reference model of the fault-free system of the aircraft engine to obtain error state equations of the fault-free system:

$$\dot{e}_p(t)=[A_0+\Delta A(\theta)]e_p(t)+[B_0+\Delta B(\theta)]\Delta u_{cp}(t)-\Delta A(\theta)x_{pref}(t)-\Delta B(\theta)u_{pref}(t)-d_f(t)$$

$$\varepsilon_{cp}(t)=C_p e_p(t)-v(t) \quad (3)$$

where $\Delta u_{cp}(t)$ and $\varepsilon_{cp}(t)$ represent the input and output difference between the reference model and aircraft engine LPV model with $\Delta u_{cp}(t)=u_{pref}(t)-u_p(t)$ and $\varepsilon_{cp}(t)=y_{pref}(t)-y_p(t)$, respectively;

step 1.2.2: representing state equations of the upper bound $\bar{e}_p$ and the lower bound $\underline{e}_p$ of the error vector $e_p$ as:

$$\dot{\bar{e}}_p(t)=[A_0-LC_p]\bar{e}_p(t)+[B_0+\overline{\Delta B}]\Delta u_{cp}(t)+L\varepsilon_{cp}(t)+|L|V-\underline{d}(t)+\overline{\Delta A}|x_{pref}(t)|+\phi_p(t) \qquad 5$$

$$\dot{\underline{e}}_p(t)=[A_0-LC_p]\underline{e}_p(t)+[B_0-\overline{\Delta B}]\Delta u_{cp}(t)+L\varepsilon_{cp}(t)-|L|V-\overline{d}(t)-\overline{\Delta A}|x_{pref}(t)|-\phi_p(t) \qquad (4)$$

where $\bar{e}_p, \underline{e}_p \in R^{n_x}$ are respectively the upper bound and the lower bound of the error vector $e_p$, i.e., $\underline{e}_p(t) \leq e_p(t) \leq \bar{e}_p(t)$; $\phi_p(t)=\overline{\Delta A}(\bar{e}_p{}^+(t)+\underline{e}_p{}^-(t))$, $\bar{e}_p{}^+=\max\{0,\bar{e}_p\}$, $\bar{e}_p{}^-=\bar{e}_p{}^+-\bar{e}_p$, $\underline{e}_p{}^+=\max\{0,\underline{e}_p\}$, $\underline{e}_p{}^-=\underline{e}_p{}^+-\underline{e}_p$; $L \in R^{n_x \times n_y}$ is an error gain matrix of the fault-free system and satisfies $A_0-LC_p \in M^{n_x \times n_x}$; $M^{n_x}$ represents a set of $n_x$-dimensional Metzler matrix; $|L|$ represents taking absolute values of all elements of the matrix $L$;

step 1.2.3: respectively setting $e_{pa}=0.5(\bar{e}_p+\underline{e}_p)$ and $e_{pd}=\bar{e}_p-\underline{e}_p$, which represent the middle value and range of the interval of $e_p$, respectively; rewriting the formula (4) as:

$$\dot{e}_{pd}(t)=[A_0-LC_p]e_{pd}(t)+2\overline{\Delta B}\Delta u_{cp}(t)+\phi_{pd}(t)+\delta_{pd}(t)$$

$$\dot{e}_{pa}(t)=[A_0-LC_p]e_{pa}(t)+B_0\Delta u_{cp}(t)+LC_p e_p(t)+\delta_{pa}(t) \qquad (5)$$

where $\phi_{pd}(t)$, $\delta_{pa}(t)$ and $\delta_{pd}(t)$ are variables defined as $$\phi_{pd}(t)=2\overline{\Delta A}(\bar{e}_p{}^-(t)+\underline{e}_p{}^-(t))$$

$$\delta_{pd}(t)=2|L|V-\underline{d}(t)+\overline{d}(t)+2\overline{\Delta A}|x_{pref}(t)| \qquad 30$$

$$\delta_{pa}(t)=-Lv(t)-0.5(\underline{d}(t)+\overline{d}(t)) \qquad (6)$$

step 1.2.4: defining output signal of the error feedback controller as:

$$\Delta u_{cp}(t)=K_a e_{pa}(t)+K_d e_{pd}(t) \qquad (7)$$

where $K_d, K_a \in R^{n_x \times n_x}$ represent gain matrices of the error feedback controller signal (7); setting $e_x(t)=e_p(t)-e_{pa}(t)$, $-0.5 e_{pd}(t) \leq e_x(t) \leq 0.5 e_{pd}(t)$, and then $$\dot{e}_{pa}(t)=[A_0+B_0 K_a]e_{pa}(t)+B_0 K_d e_{pd}(t)+LC_p e_x(t)+\delta_{pa}(t) \qquad (8)$$

step 1.2.5: rewriting formulas (5) and (8) as:

$$\dot{\xi}_p(t)=G_p(t)\xi_p(t)+\delta_p(t) \qquad (9)$$

$$G_p(t)=\begin{bmatrix} A_0-LC_p & 0 \\ B_0 K_d & A_0+B_0 K_a \end{bmatrix}+A_{pd}(t) \qquad (10)$$

where $\xi_p(t)$ is an error vector composed of the range of the error interval $e_{pd}$ and middle value of the error interval $e_{pa}$ with $$\xi_p(t)=\begin{bmatrix} e_{pd}(t)^T, e_{pa}(t)^T \end{bmatrix}^T,$$

$$\delta_p(t)=\begin{bmatrix} (\delta_{pd}(t)+2\overline{\Delta B}\Delta u_{cp}(t))^T, \delta_{pa}(t)^T \end{bmatrix}^T$$

and then $$\begin{bmatrix} \phi_{pd} \\ LC_p e_x \end{bmatrix}=A_{pd}\begin{bmatrix} e_{pd} \\ e_{pa} \end{bmatrix} \qquad (11)$$

step 1.2.6: $S^{m \times m}$ representing an m-dimensional real symmetric square matrix; setting a matrix $E,F \in SR^{2n_x \times 2n_x}$; $E,F \succ 0$ representing that each element in $E,F$ is greater than 0; constant $\lambda > 0$; and obtaining a matrix inequality:

$$G_p^T E + EG_p + \lambda E + F \prec 0 \qquad (12)$$

namely, setting each element in $G_p^T E+EG_p+\lambda E+F$ to be less than 0; solving the matrix inequality (12) to obtain the gain matrices $K_d$, $K_a$ of the error feedback controller so as to obtain the error feedback controller signal (7);

step 1.3: describing the aircraft engine LPV model having disturbance and actuator and sensor faults as:

$$\dot{x}_f(t)=[A_0+\Delta A(\theta)]x_f(t)+B_f(\gamma(t))u_f(t)+d_f(t)$$

$$y_f(t)=C_f(\phi(t))x_f+v(t) \qquad (13)$$

where $x_f \in R^{n_x}$ is a state vector of a system with fault; $u_f \in R^{n_x}$ is the control input of the system with fault; $y_f \in R^{n_y}$ is an output vector of the system with fault; $B_f(\gamma(t))$ and $C_f(\phi(t))$ are respectively actuator and sensor faults, expressed as $$B_f(\gamma(t))=[B_0+\Delta B(\theta)]\text{diag}(\gamma_1(t),\ldots,\gamma_n(t))$$

$$C_f(\phi(t))=C_p \text{diag}(\phi_1(t),\ldots,\phi_n(t)) \qquad (14)$$

where $0 \leq \gamma_i(t) \leq 1$ and $0 \leq \phi_j(t) \leq 1$ respectively represent the failure degree of the i th actuator and the j th sensor; $\gamma_i=1$ and $\gamma_i=0$ respectively represent health and complete failure of the i th actuator; $\phi_j$ is similar; $\text{diag}(\gamma_1, \gamma_2, \ldots, \gamma_n)$ represents a diagonal matrix with diagonal elements $\gamma_1, \gamma_2, \ldots, \gamma_n$; $\text{diag}(\phi_1, \phi_2, \ldots, \phi_n)$ is similar; setting $\gamma(t)$ and $\phi(t)$ estimated values respectively as $\hat{\gamma}(t)$ and $\hat{\phi}(t)$, and then $$B_f(\gamma(t))=B_f(\hat{\gamma}(t))+B_f(\Delta\gamma(t))$$

$$C_f(\phi(t))=C_f(\hat{\phi}(t))+C_f(\Delta\phi(t)) \qquad (15)$$

where $\Delta\gamma(t)=\gamma(t)-\hat{\gamma}(t)$ and $\Delta\phi(t)=\phi(t)-\hat{\phi}(t)$ are respectively errors of estimation of $\gamma(t)$ and $\phi(t)$; a virtual actuator and a virtual sensor are respectively designed according to the actuator and sensor faults;

step 1.3.1: designing the virtual sensor as:

$$\dot{x}_{vs}(t)=A_{vs}(\theta)x_{vs}(t)+B_f(\hat{\gamma}(t))\Delta u(t)+Q y_f(t)$$

$$\hat{y}_f(t)=C_{vs}x_{vs}(t)+P y_f(t) \qquad (16)$$

where $$A_{vs}(\theta)=A_0+\Delta A(\theta)-QC_f(\hat{\phi}(t))$$

$$C_{vs}=C_p-PC_f(\hat{\phi}(t)) \qquad (17)$$

where $x_{vs} \in R^{n_x}$ is a state variable of a virtual sensor; $\Delta u \in R^{n_x}$ is a difference in control inputs of a fault model and a fault reference model; $\hat{y}_f \in R^{n_y}$ is an output vector of the virtual sensor; $Q$ and $P$ are respectively parameter matrices of the virtual sensor;

step 1.3.2: a linear matrix inequality (LMI) region $S_1(\rho_1, q_1, r_1, \theta_1)$ representing an intersection of a left half complex plane region with a bound of $-\rho_1$, a circular region with a radius of $r_1$ and a circle center of $q_1$ and a fan region having an intersection angle $\theta_1$ with a negative real axis; representing a state matrix $A_{vs}$ of the virtual sensor as a polytope structure; $A_{vsj}=A_0+\Delta A(\theta_j)-Q_j C_f(\hat{\phi}(t))$, where $\theta_j$ represents the value of the j th vertex $\theta$; $A_{vsj}$ represents the value of the state matrix $A_{vs}$ of the virtual sensor of the j th vertex; a necessary and sufficient condition for eigenvalues of $A_{vsj}$ to be in $S_1(\rho_1, q_1, r_1, \theta_1)$ is that there exists a symmetrical matrix $X_1>0$ so that the linear matrix inequalities (18)-(20) are established, thereby obtaining a parameter matrix $Q_j$ of the virtual sensor of the corresponding vertex;

$$[A_0 + \Delta A(\theta_j) - Q_j C_f(\hat{\phi}(t))]X_1 + \quad (18)$$
$$X_1[A_0 + \Delta A(\theta_j) - Q_j C_f(\hat{\phi}(t))]^T + 2\rho_1 X_1 < 0$$

$$\begin{bmatrix} -r_1 X_1 & q_1 X_1 + \begin{bmatrix} A_0 + \Delta A(\theta_j) - \\ Q_j C_f(\hat{\phi}(t)) \end{bmatrix} X_1 \\ q_1 X_1 + X_1 \begin{bmatrix} A_0 + \Delta A(\theta_j) - \\ Q_j C_f(\hat{\phi}(t)) \end{bmatrix}^T & -r_1 X_1 \end{bmatrix} < 0 \quad (19)$$

$$\begin{pmatrix} \sin\theta_1 \left\{ \begin{matrix} [A_0 + \Delta A(\theta_j) - Q_j C_f(\hat{\phi}(t))]X_1 + \\ X_1[A_0 + \Delta A(\theta_j) - Q_j C_f(\hat{\phi}(t))]^T \end{matrix} \right\} \\ \cos\theta_1 \left\{ \begin{matrix} X_1[A_0 + \Delta A(\theta_j) - Q_j C_f(\hat{\phi}(t))]^T - \\ [A_0 + \Delta A(\theta_j) - Q_j C_f(\hat{\phi}(t))]X_1 \end{matrix} \right\} \end{pmatrix} \quad (20)$$

$$\begin{pmatrix} \cos\theta_1 \left\{ \begin{matrix} [A_0 + \Delta A(\theta_j) - Q_j C_f(\hat{\phi}(t))]X_1 - \\ X_1[A_0 + \Delta A(\theta_j) - Q_j C_f(\hat{\phi}(t))]^T \end{matrix} \right\} \\ \sin\theta_1 \left\{ \begin{matrix} [A_0 + \Delta A(\theta_j) - Q_j C_f(\hat{\phi}(t))]X_1 + \\ X_1[A_0 + \Delta A(\theta_j) - Q_j C_f(\hat{\phi}(t))]^T \end{matrix} \right\} \end{pmatrix} < 0$$

selecting $Q_j$ of a vertex corresponding to $\theta_j$ as a parameter matrix of the virtual sensor;

step 1.3.3: representing the parameter matrix P of the virtual sensor as:

$$P = C_p C_f^\dagger \quad (21)$$

where $\dagger$ represents pseudo-inversion of the matrix;

step 1.3.4: designing the virtual actuator as $$\dot{x}_{va}(t) = A_{va} x_{va}(t) + B_{va} \Delta u_c(t)$$

$$\Delta u(t) = M x_{va}(t) + N \Delta u_c(t)$$

$$y_c(t) = \hat{y}_f(t) + C_p x_{va}(t) \quad (22)$$

where $$A_{va} = A_0 + \Delta A(\theta) - B_f(\hat{\gamma}(t))M$$

$$B_{va} = B_0 + \Delta B(\theta) - B_f(\hat{\gamma}(t))N \quad (23)$$

where $x_{va} \in R^{n_x}$ is a state variable of the virtual actuator; $\Delta u_c \in R^{n_x}$ is the output of the error feedback controller; $y_c \in R^{n_y}$ is an output vector of the virtual actuator; M and N are respectively parameter matrices of the virtual actuator;

step 1.3.5: a linear matrix inequality (LMI) region $S_2(\rho_2, q_2, r_2, \theta_2)$ representing an intersection of a left half complex plane region with a bound of $-\rho_2$, a circular region with a radius of $r_2$ and a circle center of $q_2$ and a fan region having an intersection angle $\theta_2$ with a negative real axis; representing a state matrix $A_{va}$ of the virtual actuator as a polytope structure; $A_{vaj} = A_0 + \Delta A(\theta_j) - B_f(\hat{\gamma}(t))M_j$, where $\theta_j$ represents the value of the j th vertex $\theta$; $A_{vaj}$ represents the value of the state matrix $A_{va}$ of the virtual actuator of the j th vertex; a necessary and sufficient condition for eigenvalues of $A_{vaj}$ to be in $S_2(\rho_2, q_2, r_2, \theta_2)$ is that there exists a symmetrical matrix $X_2>0$ so that the linear matrix inequalities (24)-(26) are established, thereby obtaining a parameter matrix $M_i$ of the virtual actuator;

$$[A_0 + \Delta A(\theta_j) - B_f(\hat{\gamma}(t))M_i]X_2 + \quad (24)$$
$$X_2[A_0 + \Delta A(\theta_j) - B_f(\hat{\gamma}(t))M_i]^T + 2\rho_2 X_2 < 0$$

$$\begin{bmatrix} -r_2 X_2 & q_2 X_2 + \begin{bmatrix} A_0 + \Delta A(\theta_j) - \\ B_f(\hat{\gamma}(t))M_i \end{bmatrix} X_2 \\ q_2 X_2 + X_2 \begin{bmatrix} A_0 + \Delta A(\theta_j) - \\ B_f(\hat{\gamma}(t))M_i \end{bmatrix}^T & -r_2 X_2 \end{bmatrix} < 0 \quad (25)$$

$$\begin{pmatrix} \sin\theta_2 \left\{ \begin{matrix} [A_0 + \Delta A(\theta_j) - B_f(\hat{\gamma}(t))M_i]X_2 + \\ X_2[A_0 + \Delta A(\theta_j) - B_f(\hat{\gamma}(t))M_i]^T \end{matrix} \right\} \\ \cos\theta_2 \left\{ \begin{matrix} X_2[A_0 + \Delta A(\theta_j) - B_f(\hat{\gamma}(t))M_i]^T - \\ [A_0 + \Delta A(\theta_j) - B_f(\hat{\gamma}(t))M_i]X_2 \end{matrix} \right\} \end{pmatrix} \quad (26)$$

$$\begin{pmatrix} \cos\theta_2 \left\{ \begin{matrix} [A_0 + \Delta A(\theta_j) - B_f(\hat{\gamma}(t))M_i]X_2 - \\ X_2[A_0 + \Delta A(\theta_j) - B_f(\hat{\gamma}(t))M_i]^T \end{matrix} \right\} \\ \sin\theta_2 \left\{ \begin{matrix} [A_0 + \Delta A(\theta_j) - B_f(\hat{\gamma}(t))M_i]X_2 + \\ X_2[A_0 + \Delta A(\theta_j) - B_f(\hat{\gamma}(t))M_i]^T \end{matrix} \right\} \end{pmatrix} < 0$$

selecting $M_j$ of a vertex corresponding to $\theta_j$ as a parameter matrix of the virtual actuator;

step 1.3.6: representing the parameter matrix N of the virtual actuator as:

$$N = B_f^\dagger B_p \quad (27)$$

where $\dagger$ represents pseudo-inversion of the matrix;

step 1.4: designing an interval error observer according to the aircraft engine LPV model having disturbance and actuator and sensor faults and the reference model of the system with fault;

step 1.4.1: representing the reference model of the aircraft engine LPV model having disturbance and actuator and sensor faults as:

$$\dot{x}_{ref}(t) = A_0 x_{ref}(t) + B_f(\hat{\gamma}(t)) u_{ref}(t)$$

$$y_{ref}(t) = C_f(\hat{\phi}(t)) x_{ref}(t) \quad (28)$$

where $x_{ref} \in R^{n_x}$ is a reference state vector of the aircraft engine LPV model having disturbance and actuator and sensor faults; $u_{ref} \in R^{n_x}$ is control input of the aircraft engine LPV model having disturbance and actuator and sensor faults; $y_{ref} \in R^{n_y}$ is a reference output vector of the aircraft engine LPV model having disturbance and actuator and sensor faults;

step 1.4.2: defining an error $e(t) = x_{ref}(t) - x_f(t)$ between the aircraft engine LPV model having disturbance and actuator and sensor faults and the reference model of the aircraft engine to obtain error state equations of the system with fault of the aircraft engine based on the LPV model:

$$\dot{e}(t) = [A_0 + \Delta A(\theta)]e(t) + B_f(\hat{\gamma})\Delta u(t) - B_f(\Delta\gamma)u_f(t) - \Delta A(\theta)x_{ref}(t) - d_f(t)$$

$$\varepsilon_c(t) = C_f(\hat{\phi}(t))e(t) - C_f(\Delta\phi)x_{ref}(t) - v(t) \quad (29)$$

where $\Delta u(t)$ and $\varepsilon_c(t)$ represent the input and output difference between the reference model and faulty aircraft engine LPV model with $\Delta u(t) = u_{ref}(t) - u_f(t)$ and $\varepsilon_c(t) = y_{ref}(t) - y_f(t)$;

step 1.4.3: representing state equations of an upper bound $\overline{e}$ and a lower bound $\underline{e}$ of the error e between the aircraft engine LPV model having disturbance and actuator and sensor faults and the reference model of the aircraft engine as:

$$\bar{e}(t)=[A_0-LC_f(\phi(t))]\bar{e}(t)+[B_0+\overline{\Delta B}]\Delta u_c(t)+L[\varepsilon_c(t)+C_p x_{va}+(C_p-PC_f(\phi(t)))x_{vs}]+|L||V-\underline{d}(t)+\overline{\Delta A}|x_{ref}(t)|+\overline{\Delta B}|u_{ref}|+\phi(t)$$

$$\underline{\dot{e}}(t)=[A_0-LC_f(\phi(t))]\underline{e}(t)+[B_0-\overline{\Delta B}]\Delta u_c(t)+L[\varepsilon_c(t)+C_p x_{va}+(C_p-PC_f(\phi(t)))x_{vs}]-|L||V-\underline{d}(t)-\overline{\Delta A}|x_{ref}(t)|-\overline{\Delta B}|u_{ref}|-\phi(t) \quad (30)$$

where $\phi(t)=\overline{\Delta A}(\bar{e}_v^+(t)+\underline{e}_v^-(t))$, $e_v$ is a difference among the error state variable of the system with fault of the aircraft engine based on the LPV model, the state variable of the virtual actuator and the state variable of the virtual sensor; the upper bound of $e_v$ is $\bar{e}_v(t)=\bar{e}(t)-x_{va}(t)-x_{vs}(t)$; the lower bound of $e_v$ is $\underline{e}_v(t)=\underline{e}(t)-x_{va}(t)-x_{vs}(t)$; $A_0-LC_f \in M^{n_x \times n_x}$;

step 1.4.4: setting $e_a=0.5(\bar{e}+\underline{e}), e_d=\bar{e}-\underline{e}$, and obtaining the interval error observer from (30);

$$\dot{e}_d(t)=[A_0-LC_f(\phi(t))]e_d(t)+2\overline{\Delta B}\Delta u_c(t)+\phi_d(t)+\delta_d(t)$$

$$\dot{e}_a(t)=[A_0-LC_f]e_a(t)+B_0K_d E_a(t)+B_0K_d E_d(t)+\delta_a(t)+LC_p x_{va}+L(C_p-PC_f)+LC_f e(t) \quad (31)$$

where $\phi_d$, $\delta_d(t)$ and $\delta_a(t)$ represent equivalent range of $e_v$, range of the interval of external disturbance $v(t)$ and $d(t)$, and middle value of the interval of external disturbance $v(t)$ and $d(t)$, respectively;

$$\phi_d(t)=2\overline{\Delta A}(\bar{e}_v^+(t)+\underline{e}_v^-(t))$$

$$\delta_d(t)=2|L||V-\underline{d}(t)+\overline{d}(t)|+2\Delta A|x_{ref}(t)|2\Delta B|u_{ref}(t)|$$

$$\delta_a(t)=-Lv(t)-0.5(\underline{d}(t)+\overline{d}(t)) \quad (32)$$

step 1.5: using the aircraft engine state variable $x_f(t)$ of the aircraft engine LPV model having disturbance and actuator and sensor faults, the output variable $y_f(t)$, the reference model state variable $x_{ref}(t)$ of the system with fault, the virtual actuator state variable $x_{va}(t)$ and the virtual sensor state variable $x_{vs}(t)$ as inputs of the interval error observer; using the interval error observer output $e_a(t)$, $e_d(t)$ as the input of the error feedback controller; using the error feedback controller output $\Delta u_c(t)$ as the input of the virtual actuator; inputting the difference between the reference model output $u_{ref}(t)$ of the system with fault and the virtual actuator output $\Delta u(t)$ as a control signal into the controller having the system with fault of the aircraft engine, thereby realizing active fault tolerant control of the aircraft engine.

\* \* \* \* \*